(12) United States Patent
Ueno

(10) Patent No.: US 12,733,189 B2
(45) Date of Patent: Sep. 8, 2026

(54) SEMICONDUCTOR DEVICE

(71) Applicant: ROHM CO., LTD., Kyoto (JP)

(72) Inventor: Masaya Ueno, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 640 days.

(21) Appl. No.: 18/013,560

(22) PCT Filed: Sep. 3, 2021

(86) PCT No.: PCT/JP2021/032533
§ 371 (c)(1),
(2) Date: Dec. 29, 2022

(87) PCT Pub. No.: WO2022/065002
PCT Pub. Date: Mar. 31, 2022

(65) Prior Publication Data

US 2023/0290887 A1 Sep. 14, 2023

(30) Foreign Application Priority Data

Sep. 24, 2020 (JP) ................................ 2020-160064

(51) Int. Cl.
*H10D 8/60* (2025.01)
*H10D 62/10* (2025.01)
(Continued)

(52) U.S. Cl.
CPC ............ *H10D 8/60* (2025.01); *H10D 62/106* (2025.01); *H10D 62/126* (2025.01); *H10D 62/8325* (2025.01); *H10D 64/64* (2025.01)

(58) Field of Classification Search
CPC .. H10D 62/126; H10D 62/8325; H10D 64/64; H10D 62/129; H10D 8/051;
(Continued)

(56) References Cited

U.S. PATENT DOCUMENTS 10,186,586 B1 1/2019 Kawaguchi et al.
2008/0135969 A1 6/2008 Yoshimochi
(Continued)

FOREIGN PATENT DOCUMENTS

DE 10 2012 219510 A1 5/2013
JP 7-254718 A 10/1995
(Continued)

OTHER PUBLICATIONS

Office Action issued Sep. 7, 2023 in German Patent Application No. 11 2021 002 315.2, with Informal English Translation thereof, 12 pages.

(Continued)

*Primary Examiner* — Shahed Ahmed
(74) *Attorney, Agent, or Firm* — XSENSUS LLP

(57) ABSTRACT

A semiconductor device includes a semiconductor substrate having a principal surface, a semiconductor layer formed on the principal surface of the semiconductor substrate, the semiconductor layer including a first-conductivity-type low concentration layer in contact with the principal surface of the semiconductor substrate and a first-conductivity-type high concentration layer that is formed at a surface layer portion of a surface, which is on a side opposite to the principal surface, of the semiconductor layer and that has a higher impurity concentration than the low concentration layer, and a Schottky electrode that is formed on the surface of the semiconductor layer and that forms a Schottky junction portion between the high concentration layer and the Schottky electrode.

19 Claims, 29 Drawing Sheets

(51) Int. Cl.
*H10D 62/832* (2025.01)
*H10D 64/64* (2025.01)

(58) Field of Classification Search
CPC .......... H10D 62/105; H10D 8/60–605; H10D 62/60–605; H10D 62/106–107
See application file for complete search history.

(56) References Cited

U.S. PATENT DOCUMENTS

| | | | | |
|---|---|---|---|---|
| 2015/0380570 | A1 | 12/2015 | Tanaka | |
| 2018/0358444 | A1 | 12/2018 | Ryo et al. | |
| 2019/0371885 | A1 | 12/2019 | Mori et al. | |
| 2021/0273083 | A1 * | 9/2021 | Yamashiro | H10D 62/8325 |

FOREIGN PATENT DOCUMENTS

| | | | | |
|---|---|---|---|---|
| JP | H10308358 | A | 11/1998 | |
| JP | 2003-257888 | A | 9/2003 | |
| JP | 2005-167149 | A | 6/2005 | |
| JP | 2006-295062 | A | 10/2006 | |
| JP | 2013110388 | A | 6/2013 | |
| JP | 2016-9794 | A | 1/2016 | |
| JP | 6012743 | B2 | 10/2016 | |
| JP | 2017157665 | A | 9/2017 | |
| WO | 2013145545 | A1 | 10/2013 | |
| WO | 2018/139557 | A1 | 8/2018 | |
| WO | WO-2019073776 | A1 * | 4/2019 | H10D 8/60 |

OTHER PUBLICATIONS

International Search Report and Written Opinion mailed on Nov. 22, 2021, received for PCT Application PCT/JP2021/032533, filed on Sep. 3, 2021, 15 pages including English Translation.

Office Action dated May 29, 2025 in corresponding Japanese Patent Application No. 2022-551833 (12 pages; with English machine translation).

Office Action issued Aug. 12, 2025 in corresponding German patent application No. 11 2021 002315.2 (9 pages; with English translation).

Office Action dated Apr. 23, 2026 in corresponding Japanese Patent Application No. 2025-158859 (8 pages; with English machine translation).

Office Action dated Jul. 30, 2026 in corresponding Japanese Patent Application No. 2025-158859 (17 pages; with English machine translation).

* cited by examiner 1
10
11
7
2
5c
7a
II
31
32
30
5b
8
9
5d
5a
II
X
Y
Z 1
7
10
11
3
5c
2
4
6
9
32
30
31
30a
10a
20a
7a
III
8
n⁻
n
17
T1
21
18
16
15a
19
15c
15d
20
15b
14
15
Y
Z
X
TE
TS
5a 1
7
7a
10
11
3
2
10a
17
n
n⁻
n
SJ1
(SJ)
18
(16)
Y
Z
X
T1
TE Start
S1
Prepare substrate
S2
Epitaxial growth
S3
Form high concentration layer and low concentration layer
S4
Form guard region
S5
Form field insulating film
S6
Form Schottky metal
S7
Form anode electrode
S8
Form passivation film
S9
Form cathode electrode
End 1
7
10
11
3
5c
2
4
6
9
8
32
31
30
30a
10a
20a
7a
17
21
T1
VIB
18
16
15a
19
15c
15d
15b
20
14
15
TE
TS
5a
n-
n
Z
Y
X SJ1 (SJ)
7a
10
11
7
3
2
17
10a
41
16
18
19
14
15a
31 (30)
30a
15d
42
32 (30)
20
43
32 (30)
15
15c
15b
T1
44
Y
Z
X 1
7
10
11
3
5c
2
4
6
9
32
31
30
30a
20a
10a
7a
8
n⁻
n
17
T1
21
VIIC
18
16
15a
19
15c
15d
15b
20
Y
Z
X
14
15
TE
TS
5a SJ1 (SJ)
7a
10
7
11
3
2
17
10a
T1
16
18
SJ2 (SJ)
19
14
15a
30a
31
30
15d
20
32
15
15c
15b
Y
Z
X 1P
10
11
7
2
5c
7a
IX
31
32
30
5b
5d
51 (50)
45
9
8
5a
X
Y
Z 1P
7
10
11
3
5c
2
4
6
32
31
30
30a
9
8
9
20a
10a
7a
X
n−
n
17
45
50a
51
(50)
21
T1
18
16
19
15a
15c
15d
15b
20
14
15
Y
Z
X
TE
TS
5a 1P
7
7a
10
11
3
2
45
45
10a
17
n
PJ
p+
n−
n
51
(50)
51
(50)
50a
SJ1
(SJ)
18(16)
Z
Y
X
T1
TE 1Q
7
10
11
3
5c
2
4
6
9
8
32
31
30
30a
10a
45
20a
7a
58
(56)
57
(56)
62
60
n
n⁻
61
51
(50)
55
17
XV
21
T1
18
16
19
15a
15c
15d
15b
20
14
15
TE
TS
5a
Z
Y
X 1Q
7
7a
10
11
3
2
58(56)
57(56)
62
60
61
17
18(16)
45
10a
PJ2
(PJ)
55
PJ1(PJ)
51
(50)
60a
51(50)
50a
SJ1
(SJ)
58
(56)
p+
n
n-
T1
TE
X
Y
Z 7
7a
10
11
3
2
80
51 (50)
51 (50)
45
n
p+
n−
X
Y
Z 7a
10
11
7
3
2
81
45
51 (50)
51 (50)
p+
n
n-
X
Y
Z 7a
10
11
7
3
2
81
60
62
61
55
51 (50)
57 (56)
58 (56)
45
n
p+
n-
X
Y
Z 1Q
7
7a
10
11
3
2
58(56)
57(56)
60
61
62
55
17
18(16)
45
10a
PJ2
(PJ)
PJ1 (PJ)
51
(50)
60a
51 (50)
50a
SJ1
(SJ)
58
(56)
p+
n
n−
T1
TE
X
Y
Z 1Q
7
7a
10
11
3
2
58(56)
57(56)
60
61
62
55
45
10a
60a
PJ2
(PJ)
PJ1 (PJ)
51
(50)
51 (50)
50a
SJ1
(SJ)
17
18(16)
58(56)
n
p+
n−
X
Y
Z 1Q
7
7a
10
11
3
2
58(56)
57(56)
62
61
60
17
18(16)
n
p+
45
10a
PJ2
(PJ)
59B
(59)
55
PJ1(PJ)
n-
59A
(59)
60a
50a
SJ1
(SJ)
58(56)
Z
Y
X 7
7a
10
11
3
2
51(50)
58(56)
45
82
10a
83
p+
n
n−
Z
Y
X 7
7a
10
11
3
2
51(50)
58(56)
45
84
10a
83
p+
n
n-
X
Y
Z 1Q
7
7a
10
11
3
2
84
51(50)
58(56)
45
10a
57(56)
59
55
60
61
62
n
$p^+$
$n^-$
X
Y
Z

SEMICONDUCTOR DEVICE

CROSS-REFERENCE TO RELATED APPLICATIONS

The present application is based on PCT filing PCT/JP2021/032533, filed Sep. 3, 2021, which claims priority to Japanese Patent Application No. 2020-160064, filed in the Japan Patent Office on Sep. 24, 2020, the entire disclosure of each is incorporated herein by reference.

TECHNICAL FIELD

The present invention relates to a semiconductor device that includes a Schottky barrier diode.

BACKGROUND ART

In a Schottky barrier diode, a barrier height is ordinarily adjusted by making a selection from various barrier metals that form a Schottky barrier. The value of a forward voltage drop or of a reverse leakage current is adjusted by adjusting the barrier height. However, the barrier metals are limited in kind, and therefore it is not easy to make an adjustment so as to obtain a desired barrier height.

In a Schottky barrier diode disclosed by Patent Literature 1 mentioned below, a second barrier metal that derives from a second barrier metal film is introduced into a silicide layer formed by a reaction between silicon that derives from a substrate and a first barrier metal that derives from a thin film of a first barrier metal.

CITATION LIST

Patent Literature

Patent Literature 1: Japanese Patent Application Publication No. 2003-257888

SUMMARY OF INVENTION

Technical Problem

In the Schottky barrier diode of Patent Literature 1, it is difficult to manage a heat treatment temperature, at which the silicide layer is formed, so as to keep the temperature constant, and the Schottky barrier diode has a limitation in the adjustable range of the barrier height.

Therefore, an object of the present invention is to provide a semiconductor device in which the barrier height has been reduced.

Solution to Problem

The semiconductor device of the present disclosure includes a semiconductor substrate having a principal surface, a semiconductor layer formed on the principal surface of the semiconductor substrate, the semiconductor layer including a first-conductivity-type low concentration layer in contact with the principal surface of the semiconductor substrate and a first-conductivity-type high concentration layer that is formed at a surface layer portion of a surface, which is on a side opposite to the principal surface, of the semiconductor layer and that has a higher impurity concentration than the low concentration layer, and a Schottky electrode that is formed on the surface of the semiconductor layer and that forms a Schottky junction portion between the high concentration layer and the Schottky electrode.

According to this configuration, the Schottky junction portion is formed between the high concentration layer whose impurity concentration is higher than the low concentration layer and the Schottky electrode in the semiconductor layer. Therefore, it is possible to make the barrier height smaller than the Schottky junction portion formed between the low concentration layer and the Schottky electrode.

The aforementioned or still other objects, features, and effects of the present invention will be clarified by the following description of preferred embodiments given below with reference to the accompanying drawings.

DESCRIPTION OF EMBODIMENTS

First Preferred Embodiment

Figure 1:
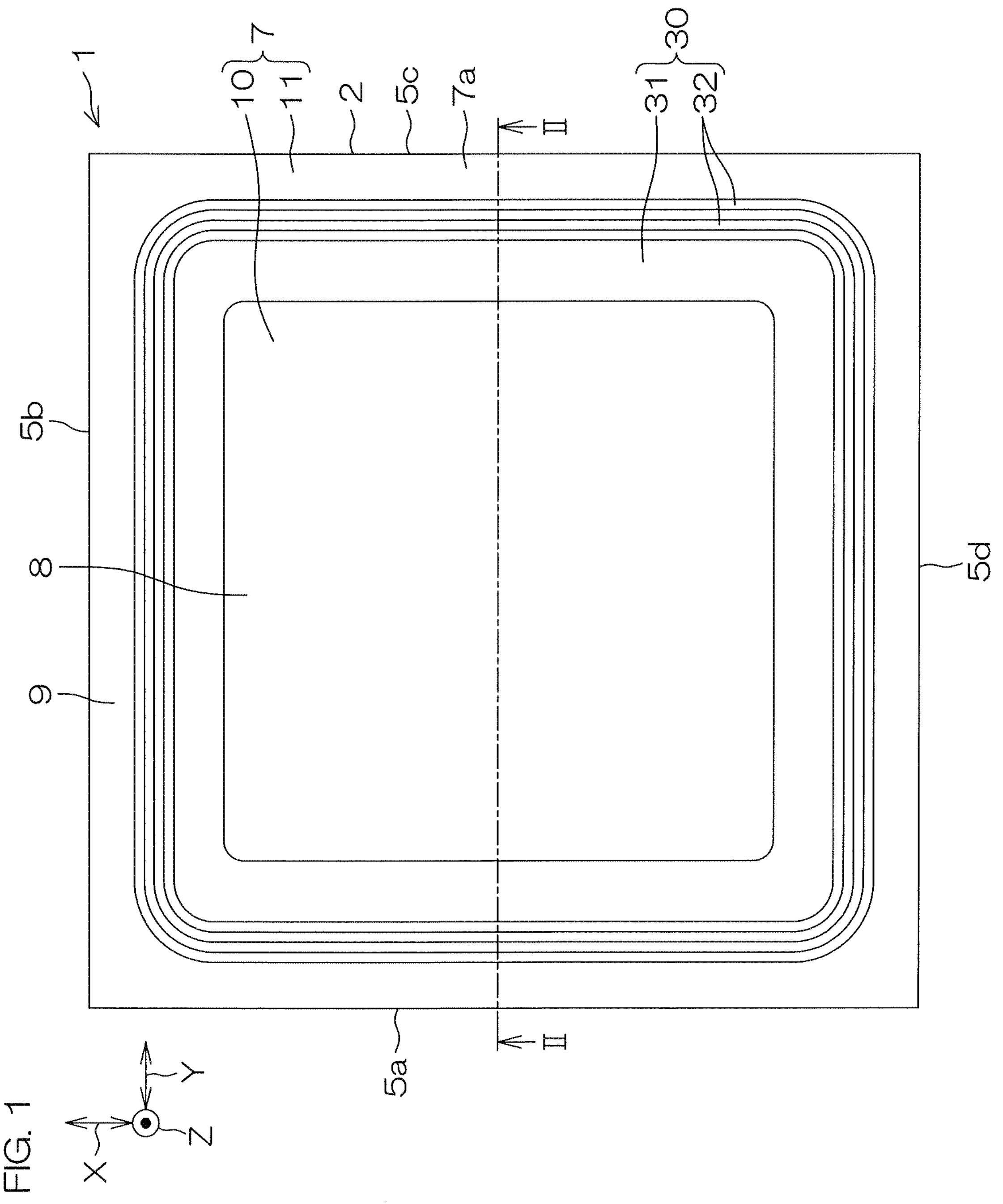
FIG. 1 is a plan view of a main portion of a Schottky barrier diode according to a first preferred embodiment.
Figure 2:
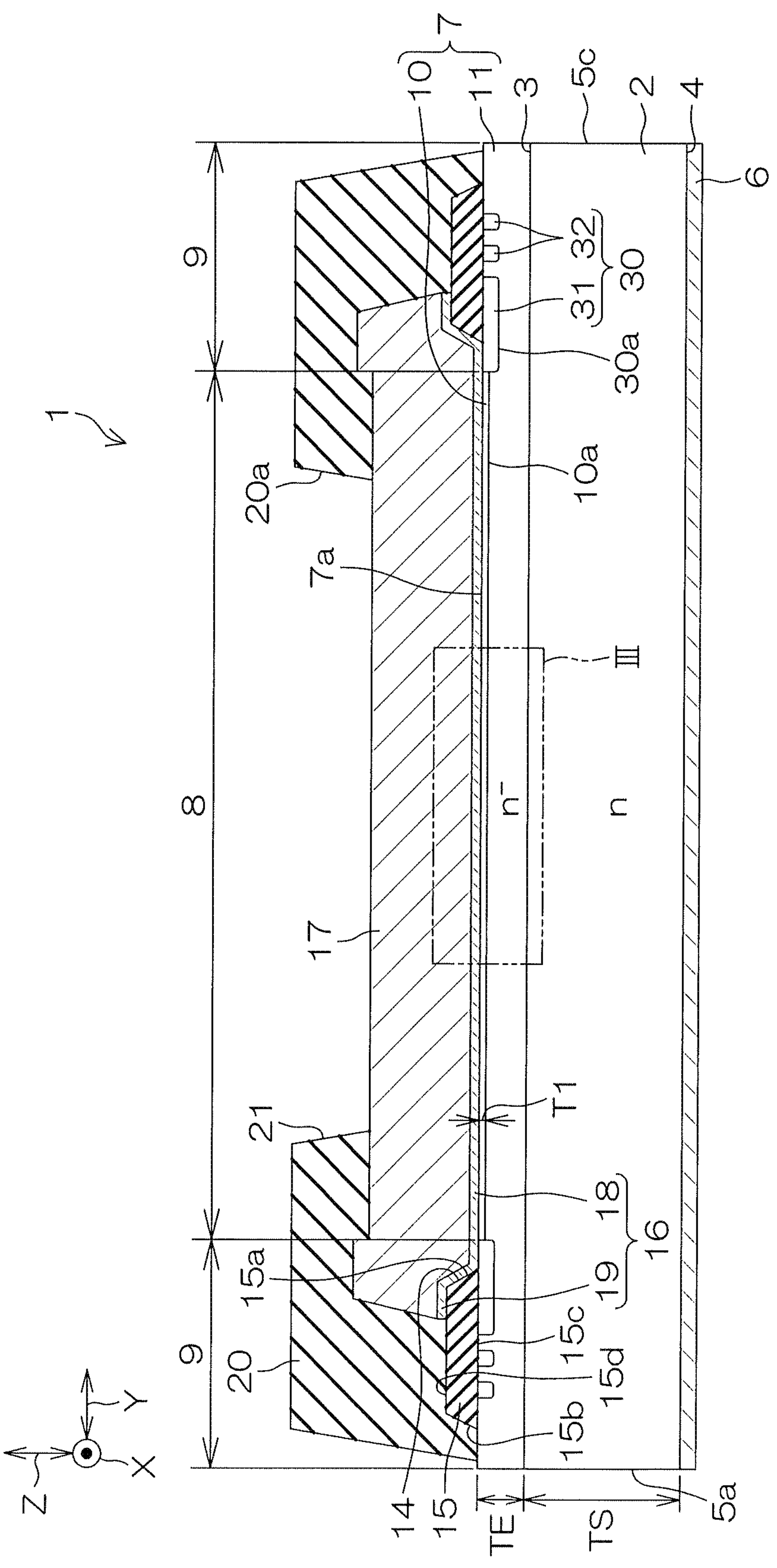
FIG. 2 is a cross-sectional view along line II-II shown in FIG. 1.
Figure 3:
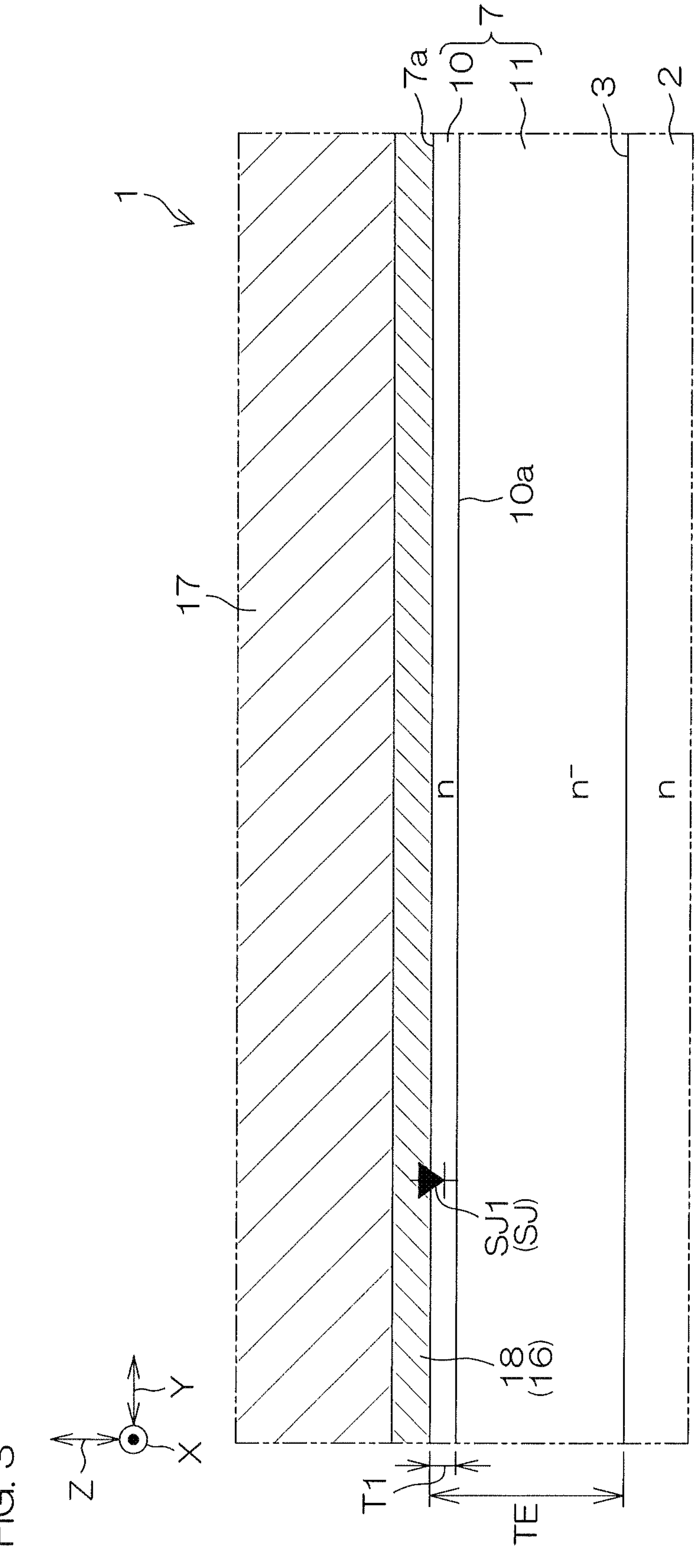
FIG. 3 is an enlarged view of region III shown in FIG. 2.

FIG. 1 is a plan view of a main portion of a Schottky barrier diode 1 serving as a semiconductor device according to a first preferred embodiment. FIG. 2 is a cross-sectional view along line II-II shown in FIG. 1. FIG. 3 is an enlarged view of region III shown in FIG. 2.

In FIG. 1, a field insulating film 15, a Schottky metal 16, an anode electrode 17, and a passivation layer 20, which are described later, are excluded. A configuration of the Schottky barrier diode 1 will be hereinafter described with reference to FIG. 1 to FIG. 3.

The Schottky barrier diode 1 employs 4H-SiC (wide bandgap semiconductor whose dielectric breakdown electric-field is about 2.8 MV/cm and whose bandgap width is about 3.26 eV), and is formed in the shape of, for example, a square chip in a plan view. The length of each side of the chip-shaped Schottky barrier diode 1 is 0.5 mm to 20 mm. In other words, the chip size of the Schottky barrier diode 1 is, for example, 0.5 mm/□ to 20 mm/□.

The Schottky barrier diode 1 includes an n type (first-conductivity-type) semiconductor substrate 2 constituted of SiC. In other words, the semiconductor substrate 2 is a SiC substrate. Preferably, the off angle of the semiconductor substrate 2 is 4° or less. For example, N (nitrogen), P (phosphorus), As (arsenic), or the like is used as an n type impurity.

The semiconductor substrate 2 has a first principal surface 3 on one side (see FIG. 2), a second principal surface 4 on the other side (see FIG. 2), and side surfaces 5_a_, 5_b_, 5_c_, and 5_d_ by which the first and second principal surfaces 3 and 4 are connected together. The first principal surface 3 and the second principal surface 4 are each formed in a quadrangular shape (in this embodiment, a square shape) in a plan view seen from a normal direction Z of those principal surfaces (which is hereinafter referred to simply as a "plan view").

In this embodiment, the side surfaces 5_a_ and 5_c_ extend along a first direction X, and face each other in a second direction Y intersecting the first direction X. In this embodiment, the side surfaces 5_b_ and 5_d_ extend along the second direction Y, and face each other in the first direction X. In more detail, the second direction Y is a direction perpendicular to the first direction X.

The Schottky barrier diode 1 additionally includes a cathode electrode 6 that serves as an ohmic electrode and that is formed so as to cover the whole area of the second principal surface 4 of the semiconductor substrate 2. The cathode electrode 6 is constituted of a metal that makes an ohmic contact with n type SiC. For example, Ti/Ni/Ag or Ti/Ni/Au/Ag can be mentioned as the metal making an ohmic contact with n type SiC.

The Schottky barrier diode 1 additionally includes an epitaxial layer 7 that is constituted of n type SiC and that is formed on the first principal surface 3 of the semiconductor substrate 2. The epitaxial layer 7 is an example of a semiconductor layer.

A thickness TS of the semiconductor substrate 2 may be not less than 40 μm and not more than 150 μm. The thickness TS may be not less than 40 μm and not more than 50 μm, not less than 50 μm and not more than 60 μm, not less than 60 μm and not more than 70 μm, not less than 70 μm and not more than 80 μm, not less than 80 μm and not more than 90 μm, not less than 90 μm and not more than 100 μm, not less than 100 μm and not more than 110 μm, not less than 110 μm and not more than 120 μm, not less than 120 μm and not more than 130 μm, not less than 130 μm and not more than 140 μm, or not less than 140 μm and not more than 150 μm. Preferably, the thickness TS is not less than 40 μm and not more than 130 μm.

A thickness TE of the epitaxial layer 7 may be not less than 1 μm and not more than 50 μm. The thickness TE may be not less than 1 μm and not more than 5 μm, not less than 5 μm and not more than 10 μm, not less than 10 μm and not more than 15 μm, not less than 15 μm and not more than 20 μm, not less than 20 μm and not more than 25 μm, not less than 25 μm and not more than 30 μm, not less than 30 μm and not more than 35 μm, not less than 35 μm and not more than 40 μm, not less than 40 μm and not more than 45 μm, or not less than 45 μm and not more than 50 μm. Preferably, the thickness TE is not less than 5 μm and not more than 15 μm.

The epitaxial layer 7 includes a low concentration layer 11 in contact with the first principal surface 3 of the semiconductor substrate 2 and a high concentration layer 10 formed on a surface layer portion of a surface 7_a_, which is on the side opposite to the first principal surface 3, of the epitaxial layer 7. The high concentration layer 10 is a region into which an n type impurity has been injected in the epitaxial layer 7. The low concentration layer 11 is a region into which an n type impurity has not been injected in the epitaxial layer 7. Therefore, the high concentration layer 10 and the low concentration layer 11 are formed by injecting an n type impurity.

The n type impurity concentration of the low concentration layer 11 is lower than the n type impurity concentration of the semiconductor substrate 2. The n type impurity concentration of the high concentration layer 10 is higher than the n type impurity concentration of the low concentration layer 11. The n type impurity concentration of the high concentration layer 10 may be equal to the impurity concentration of the semiconductor substrate 2. The n type impurity concentration of the semiconductor substrate 2 may be not less than $1.0\times10^{18}$ $cm^{-3}$ and not more than $1.0\times10^{21}$ $cm^{-3}$. The n type impurity concentration of the low concentration layer 11 may be not less than $1.0\times10^{15}$ $cm^{-3}$ and not more than $1.0\times10^{18}$ $cm^{-3}$. Preferably, the n type impurity concentration of the low concentration layer 11 is equal to or more than $1.0\times10^{15}$ $cm^{-3}$ and less than $1.0\times10^{17}$ $cm^{-3}$. The n type impurity concentration of the high concentration layer 10 is, for example, not less than $1.0\times10^{17}$ $cm^{-3}$ and not more than $1.0\times10^{20}$ $cm^{-3}$.

For example, N (nitrogen), P (phosphorus), As (arsenic), or the like is used as the n type impurity. The n type impurity of the high concentration layer 10 and the n type impurity of the low concentration layer 11 may differ from each other. For example, arsenic may be used as the n type impurity of the semiconductor substrate 2, phosphorus may be used as the n type impurity of the high concentration layer 10, and nitrogen may be used as the n type impurity of the low concentration layer 11.

A thickness T1 of the high concentration layer 10 is smaller than the thickness TE of the epitaxial layer 7. The thickness T1 of the high concentration layer 10 is, for example, not less than 0.1 μm and not more than 0.2 μm.

An active region 8 and a non-active region 9 are set at the surface 7*a* of the epitaxial layer 7. The active region 8 is set at a central portion of the epitaxial layer 7 in an inward region at a distance from the side surfaces 5*a* to 5*d* of the semiconductor substrate 2 in a plan view. The active region 8 is set in a quadrangular shape having four sides parallel to the side surfaces 5*a* to 5*d* of the semiconductor substrate 2 in a plan view.

The non-active region 9 is set between the side surfaces 5*a* to 5*d* of the semiconductor substrate 2 and a peripheral edge of the active region 8. The non-active region 9 is set in an endless shape (in this embodiment, a quadrangular annular shape) surrounding the active region 8 in a plan view.

The Schottky barrier diode 1 additionally includes a $p^+$ type (second-conductivity-type) guard region 30 formed at the surface layer portion of the surface 7*a* of the epitaxial layer 7 in the non-active region 9. The guard region 30 is formed in an endless shape (for example, a quadrangular annular shape, a quadrangular annular shape that has been chamfered, or a circular annular shape) surrounding the active region 8 in a plan view. Hence, the guard region 30 is formed as a guard ring region. In this embodiment, the active region 8 is defined by an inward end of the guard region 30.

The guard region 30 includes a first guard region 31 that is wide and a plurality of (in an example shown in FIG. 1, two) second guard regions 32 that surround the first guard region 31 and each of which is smaller in width than the first guard region 31. The second guard regions 32 are disposed so as to have mutually-equal distances from an outward end of the first guard region 31. Unlike the example of FIG. 1, the guard region 30 may be formed by a single region having an endless shape (for example, a quadrangular annular shape, a quadrangular annular shape that has been chamfered, or a circular annular shape).

The high concentration layer 10 is formed in the active region 8. The high concentration layer 10 is formed at the surface layer portion of the surface 7*a* of the epitaxial layer 7 in the whole area of the active region 8 in the example of FIG. 2. Therefore, the high concentration layer 10 is in contact with the whole area of an inward end portion of the first guard region 31 in a plan view. The innermost second guard region 32 faces the first guard region 31 with the low concentration layer 11 therebetween in a plan view. Adjoining second guard regions 32 face each other with the low concentration layer 11 therebetween in a plan view.

A bottom portion 10*a* of the high concentration layer 10 is positioned closer to the surface 7*a* of the epitaxial layer 7 than to a bottom portion 30*a* of the guard region 30 (in more detail, a bottom portion of the first guard region 31).

The Schottky barrier diode 1 additionally includes an annular field insulating film 15 formed on the surface 7*a* of the epitaxial layer 7. The field insulating film 15 covers a part of the surface 7*a* of the epitaxial layer 7 in the non-active region 9. The field insulating film 15 has an opening 14 by which a part of the surface 7*a* of the epitaxial layer 7 is exposed.

The active size of the active region 8 is, for example, not less than 0.1 $mm^2$ and not more than 400 $mm^2$. The field insulating film 15 may have a single layer structure constituted of, for example, a $SiO_2$ (silicon oxide) layer or a SiN (silicon nitride) layer. The thickness of the field insulating film 15 is, for example, not less than 0.5 μm and not more than 3 μm.

The field insulating film 15 has an inner surface 15*a* that inclines with respect to the surface 7*a* of the epitaxial layer 7 so as to proceed toward the epitaxial-layer-7 side in proportion to progress to the inside of the field insulating film 15, an outer surface 15*b* that inclines with respect to the surface 7*a* of the epitaxial layer 7 so as to proceed toward the epitaxial-layer-7 side in proportion to progress to the outside of the field insulating film 15, and a first connection surface 15*c* and a second connection surface 15*d* each of which connects the inner surface 15*a* and the outer surface 15*b* together and each of which extends in parallel with the surface 7*a* of the epitaxial layer 7. The first connection surface 15*c* is in contact with the surface 7*a* of the epitaxial layer 7. The second connection surface 15*d* is positioned on the side opposite to the epitaxial layer 7 with respect to the first connection surface 15*c*.

The Schottky barrier diode 1 includes the Schottky metal 16 that serves as a Schottky electrode formed on the surface 7*a* of the epitaxial layer 7 and the anode electrode 17 formed on the Schottky metal 16.

A Schottky junction portion SJ is formed near a contact interface between the Schottky metal 16 and the epitaxial layer 7. The Schottky junction portion SJ includes a first Schottky junction portion SJ1 formed between the Schottky metal 16 and the high concentration layer 10.

For example, Ti, Ni, Al, Mo, or the like can be used as the Schottky metal 16. The Schottky metal 16 includes a first covering portion 18 that covers the surface 7*a* of the epitaxial layer 7 in the active region 8 and a second covering portion 19 that covers the field insulating film 15. The second covering portion 19 covers the entirety of the inner surface 15*a* of the field insulating film 15 and a part of the second connection surface 15*d*. The part, which is covered by the second covering portion 19, of the second connection surface 15*d* is smaller in a plan view than a part, which is positioned outside the second covering portion 19, of the second connection surface 15*d*.

The first guard region 31 is in contact with the Schottky metal 16 and with the field insulating film 15, and the second guard regions 32 are in contact with the field insulating film 15.

The anode electrode 17 may include at least one among Ti, Ni, Al, Mo, and conductive polysilicon.

The Schottky barrier diode 1 additionally includes the passivation layer 20 formed on the anode electrode 17. The passivation layer 20 is an insulating layer. The passivation layer 20 may have a single layer structure constituted of a silicon oxide layer or a silicon nitride layer, or may have a laminated structure including a silicon oxide layer and a silicon nitride layer. If the passivation layer 20 has a laminated structure, a silicon oxide layer may be formed on a silicon nitride layer, or the silicon nitride layer may be formed on the silicon oxide layer. In this embodiment, the passivation layer 20 has a single layer structure constituted of a silicon nitride layer.

The passivation layer 20 is formed in an inward region at a distance inwardly from the side surfaces 5*a* to 5*d* of the semiconductor substrate 2 in a plan view. The passivation layer 20 has a sub pad opening 21 formed to expose a part of the anode electrode 17 as a pad region.

Figure 4:
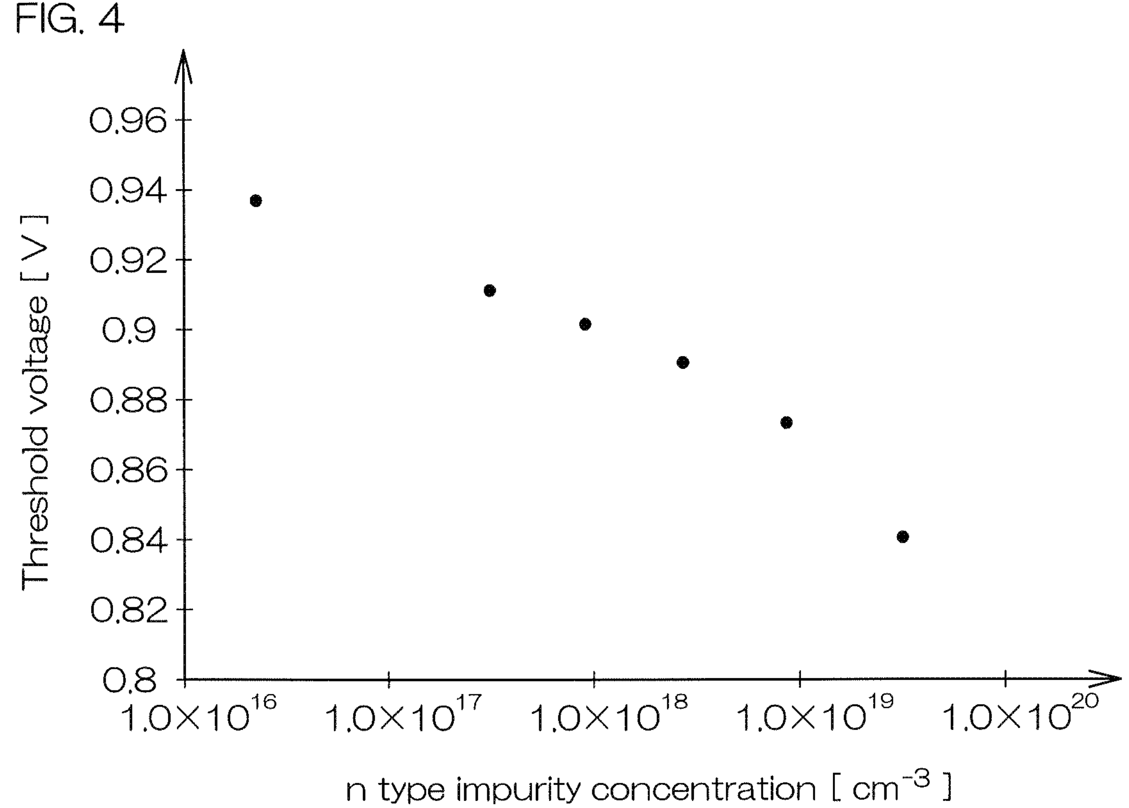
FIG. 4 is a graph showing a relationship between an n type impurity concentration of a part of an epitaxial layer, which forms a Schottky junction portion between a Schottky metal and the epitaxial layer, and a threshold voltage of a Schottky barrier diode.

FIG. 4 is a graph showing a relationship between an n type impurity concentration of a part of an epitaxial layer 7, which forms a Schottky junction portion SJ between a Schottky metal 16 and the epitaxial layer 7, and a threshold voltage Vth of a Schottky barrier diode 1.

The rising voltage (threshold voltage Vth) in a forward direction of the Schottky junction portion becomes larger in proportion to an increase in barrier height. As shown in FIG. 4, the threshold voltage Vth becomes smaller in proportion to a rise in the n type impurity concentration of a part of the epitaxial layer 7 in which the Schottky junction portion SJ is formed between the Schottky metal 16 and the epitaxial layer 7. If the n type impurity concentration is $1.0\times10^{17}$ $cm^{-3}$ or more, it is possible to reduce the threshold voltage Vth to a sufficiently small value, i.e., in more detail, it is possible to adjust the threshold voltage Vth so as to be 0.93 V or less. As described above, the n type impurity concentration of the high concentration layer 10 is, for example, not less than $1.0\times10^{17}$ $cm^{-3}$ and not more than $1.0\times10^{20}$ $cm^{-3}$, and therefore it is possible to reduce the threshold voltage to a sufficiently small value.

On the other hand, as described above, the n type impurity concentration of the low concentration layer 11 is, for example, equal to or more than $1.0\times10^{15}$ $cm^{-3}$ and less than $1.0\times10^{17}$ $cm^{-3}$. Therefore, in a configuration in which the Schottky metal 16 and the low concentration layer 11 form a Schottky junction portion SJ, which differs from that of the present preferred embodiment, the threshold voltage Vth is larger than 0.95 V.

In other words, in a configuration in which a Schottky junction portion SJ is formed between the high concentration layer 10 and the Schottky metal 16 as in the first preferred embodiment, it is possible to make the barrier height smaller than in a configuration in which a Schottky junction portion SJ is formed between the Schottky metal 16 and the low concentration layer 11.

It is possible to freely adjust the barrier height by adjusting the injection degree of an n type impurity into the surface layer portion of the epitaxial layer 7. In other words, the degree of design freedom of the Schottky barrier diode 1 is improved. For example, if the n type impurity concentration is adjusted to be $1.0\times10^{20}$ $cm^{-3}$, the threshold voltage Vth can be adjusted to be about 0.82 V.

A depletion layer formed by the guard region 30 when a reverse voltage is applied effectively spreads from a part, which is in contact with the low concentration layer 11, of an inward end portion of the guard region 30 (in the example of FIG. 2, an inward end portion of the first guard region 31). Therefore, in a case in which the inward end portion of the guard region 30 is in contact with both the low concentration layer 11 and the high concentration layer 10, the depletion layer formed by the guard region 30 when a reverse voltage is applied more easily spreads than in a case in which the inward end portion of the guard region 30 (in the example of FIG. 2, the inward end portion of the first guard region 31) is in contact with only the high concentration layer 10.

If the bottom portion 10*a* of the high concentration layer 10 whose n type impurity concentration is higher than the low concentration layer 11 is configured to be positioned closer to the surface 7*a* of the epitaxial layer 7 than to the bottom portion 30*a* of the guard region 30 (in the example of FIG. 2, the bottom portion of the first guard region 31) as in the first preferred embodiment, the inward end portion of the guard region 30 is in contact with both the low concentration layer 11 and the high concentration layer 10. Therefore, it is possible to spread the depletion layer to the inside the guard region 30 when a reverse voltage is applied. This makes it possible to restrain a drop in the surge withstand voltage that is caused by the provision of the high concentration layer 10.

Figure 5:
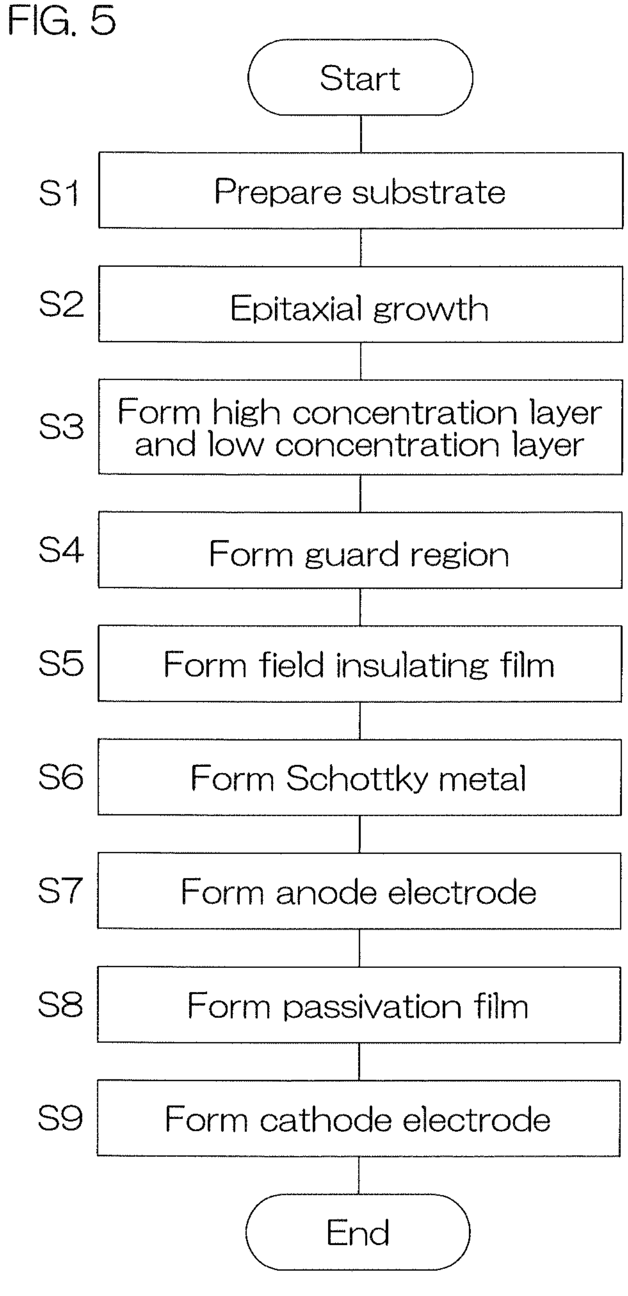
FIG. 5 is a flowchart of a method of manufacturing the Schottky barrier diode.

Next, a method of manufacturing the Schottky barrier diode 1 will be described. FIG. 5 is a flowchart shown to describe an example of the method of manufacturing the Schottky barrier diode 1 shown in FIG. 1.

First, the semiconductor substrate 2 is prepared in order to manufacture the Schottky barrier diode 1 (step S1). Next, the n type epitaxial layer 7 is grown up from the first principal surface 3 of the semiconductor substrate 2 (step S2). Next, an n type impurity is implanted into the surface layer portion of the surface 7*a* of the epitaxial layer 7 through, for example, an ion implantation mask. As a result, the high concentration layer 10 and the low concentration layer 11 are formed (step S3). Next, the guard region 30 is formed, for example, by implanting a p type impurity through an ion implantation mask (step S4).

Thereafter, the field insulating film 15 is formed on the epitaxial layer 7 by, for example, a CVD (Chemical Vapor Deposition) method (step S5). Next, the Schottky metal 16 is formed on the field insulating film 15 by, for example, a sputtering method (step S6). Next, aluminum or the like is formed on the anode electrode 17 by, for example, the sputtering method (step S7). Next, the passivation layer 20 is formed on the anode electrode 17 by, for example, the CVD method (step S8). Thereafter, finally, the cathode electrode 6 is formed in the whole area of the second principal surface 4 of the semiconductor substrate 2 by, for example, the sputtering method (step S9).

Next, a first modification example and a second modification example of the Schottky barrier diode 1 will be described with reference to FIG. 6A to FIG. 7C.

Figure 6A:
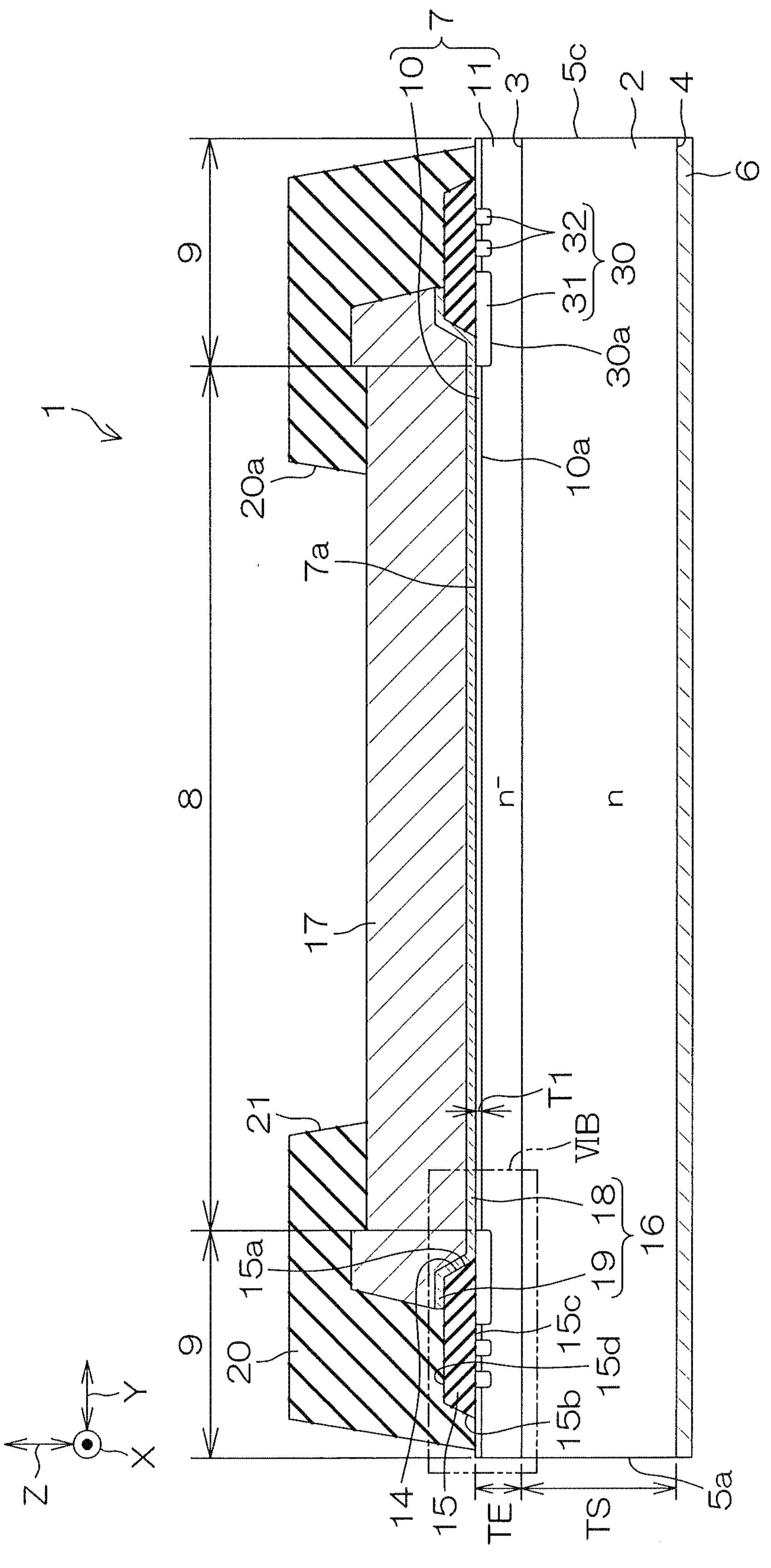
FIG. 6A is a cross-sectional view of a first modification example of the Schottky barrier diode.
Figure 6B:
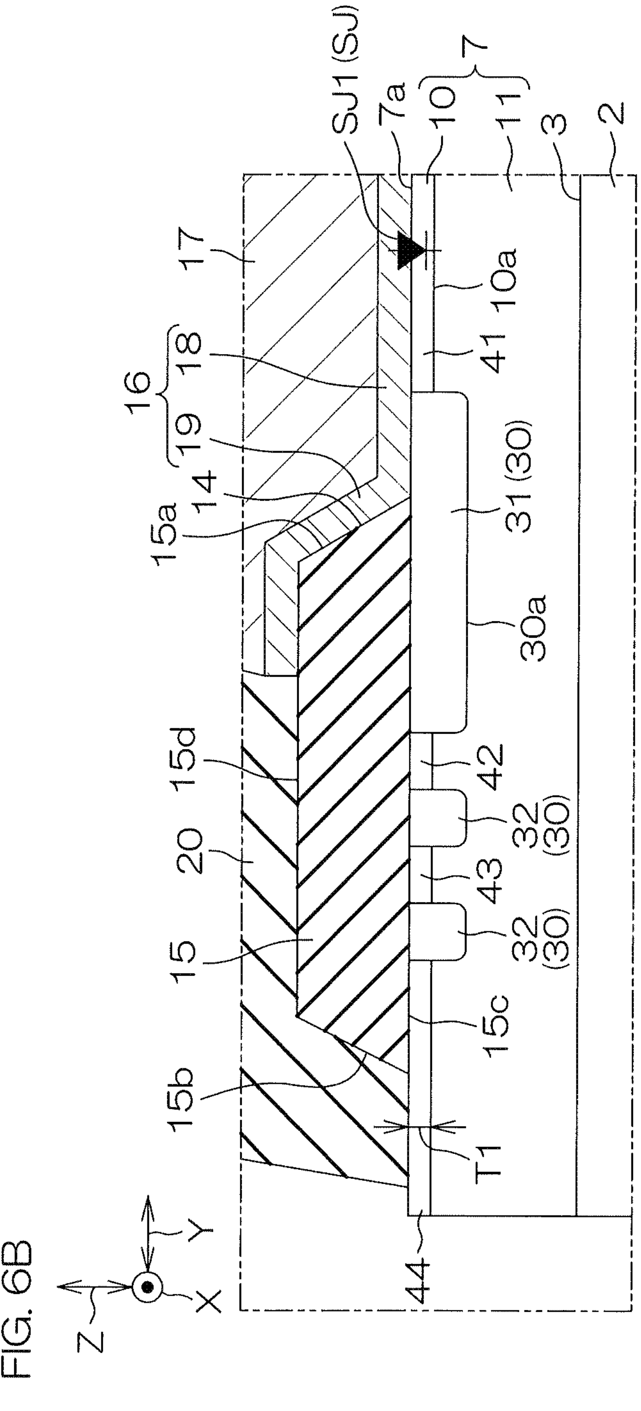
FIG. 6B is an enlarged view of region VIB shown in FIG. 6A.

FIG. 6A is a cross-sectional view of the Schottky barrier diode 1 according to the first modification example. FIG. 6B is an enlarged view of region VIB shown in FIG. 6A. FIG. 6A is a cross-sectional view of the same part as in FIG. 2. In FIG. 6A and FIG. 6B, the same reference sign as in FIG. 1 to FIG. 5 mentioned above is given to a component equivalent to each component shown in FIG. 1 to FIG. 5, and a description of the component is omitted.

In the Schottky barrier diode 1 according to the first modification example, the high concentration layer 10 is formed at the surface layer portion of the surface 7*a* of the epitaxial layer 7 not only in the active region 8 but also in the non-active region 9. The high concentration layer 10 is exposed from a side surface of the epitaxial layer 7.

In detail, the high concentration layer 10 includes a first region 41 disposed inside than the inward end portion of the first guard region 31, a second region 42 between the first guard region 31 and the innermost second guard region 32, a third region 43 between the adjoining second guard regions 32, and a fourth region 44 disposed outside than an outward end of the outermost second guard region 32.

The first region 41 is in contact with the whole area of the inward end portion of the first guard region 31 in a plan view. The second region 42 is in contact with an outward end portion of the first guard region 31 and with an inward end portion of the innermost second guard region 32. The third region 43 is in contact with both an outward end portion of the inner second guard region 32 of the mutually adjoining second guard regions 32 and the inward end portion of the outer second guard region 32 of the mutually adjoining second guard regions 32. The fourth region 44 is in contact with the outward end portion of the outermost second guard region 32. The fourth region 44 is exposed from the side surface of the epitaxial layer 7.

Figure 7A:
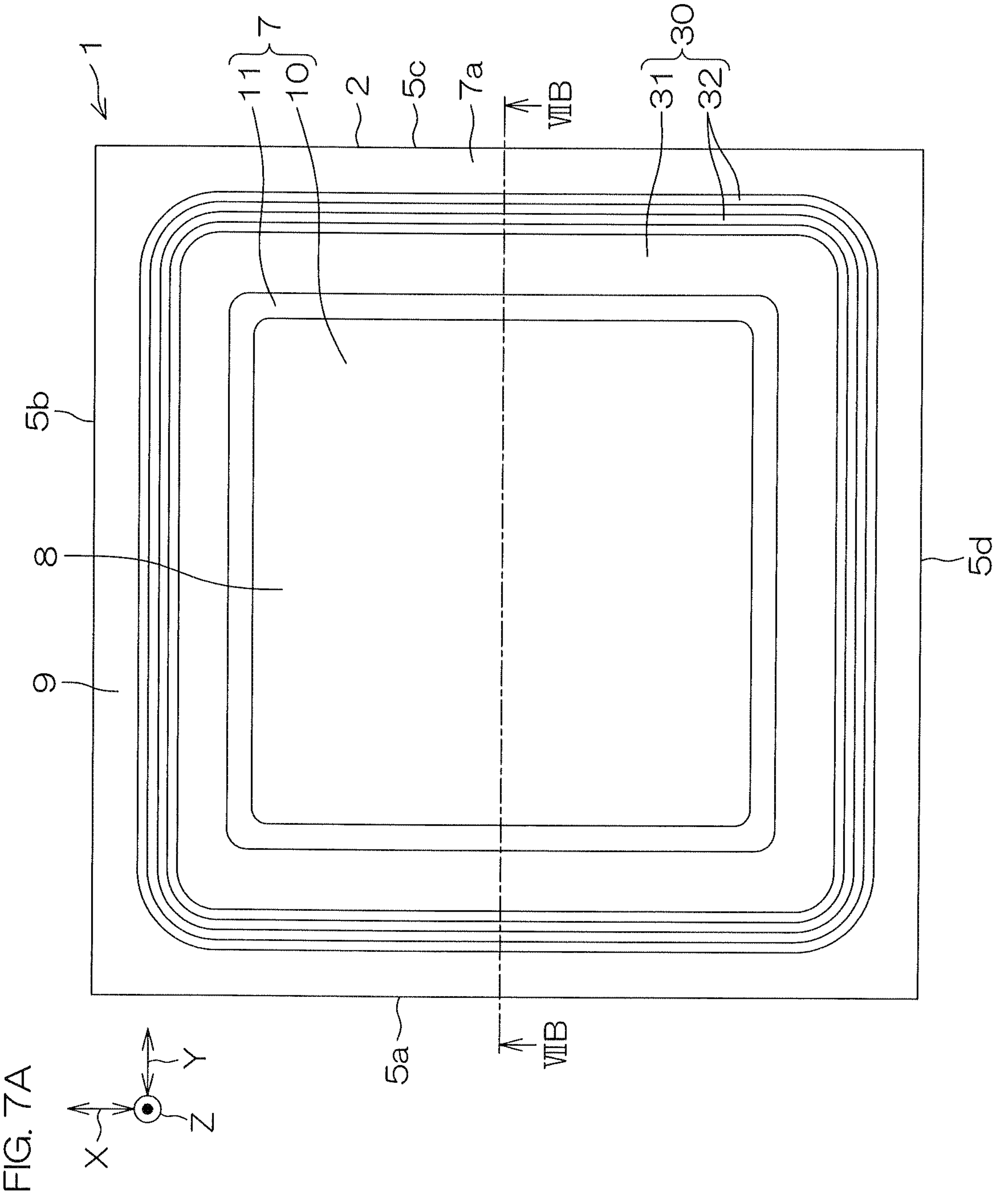
FIG. 7A is a plan view of a main portion of a second modification example of the Schottky barrier diode.
Figure 7B:
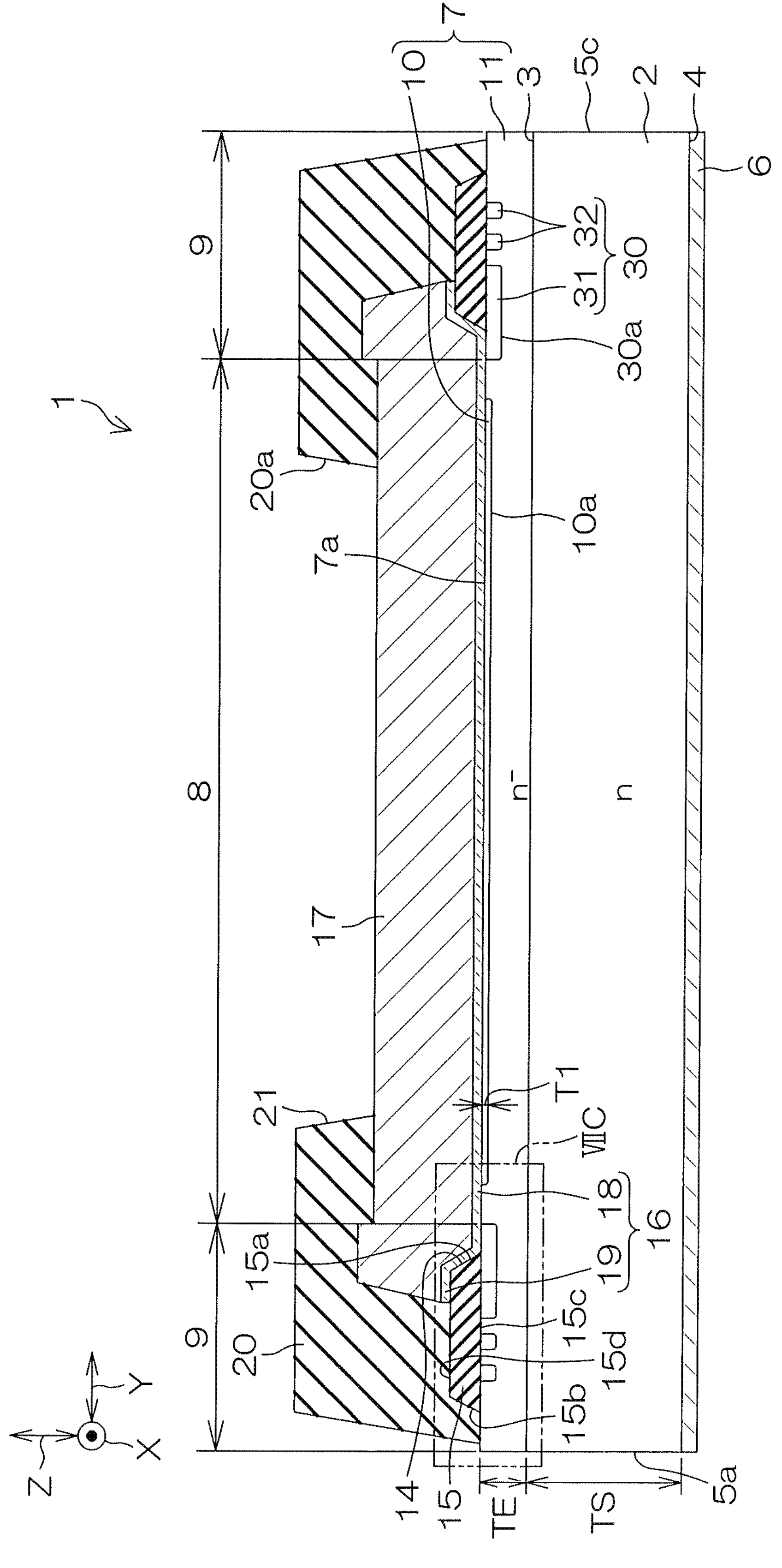
FIG. 7B is a cross-sectional view along line VIIB-VIIB shown in FIG. 7A.
Figure 7C:
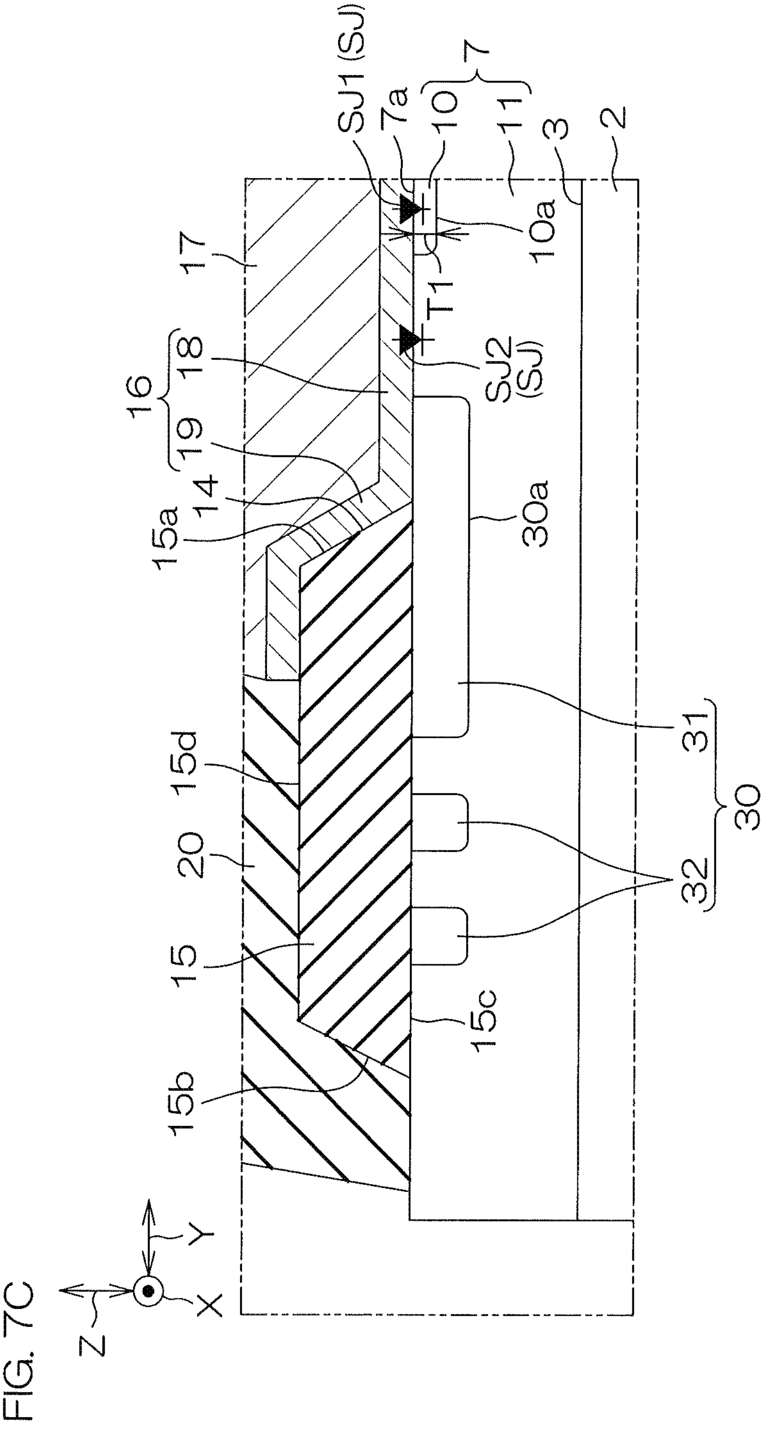
FIG. 7C is an enlarged view of region VIIC shown in FIG. 7B.

FIG. 7A is a plan view of a main portion of the Schottky barrier diode 1 according to the second modification example. FIG. 7B is a cross-sectional view along line VIIB-VIIB shown in FIG. 7A. FIG. 7C is an enlarged view of region VIIC shown in FIG. 7B. FIG. 7B is a cross-sectional view of the same part as in FIG. 2. In FIG. 7A and FIG. 7B, the same reference sign as in FIG. 1 to FIG. 6B mentioned above is given to a component equivalent to each component shown in FIG. 1 to FIG. 6B, and a description of the component is omitted.

In the Schottky barrier diode 1 according to the second modification example, the low concentration layer 11 is positioned between the high concentration layer 10 and the guard region 30 in a plan view. The high concentration layer 10 is surrounded by the low concentration layer 11 in a plan view. The high concentration layer 10 faces the first guard region 31 with the low concentration layer 11 therebetween in a plan view.

The low concentration layer 11 is in contact with the Schottky metal 16 at a position between the first guard region 31 and the high concentration layer 10. Therefore, the Schottky junction portion SJ is formed not only between the Schottky metal 16 and the high concentration layer 10 but also between the Schottky metal 16 and the low concentration layer 11. In other words, the Schottky junction portion SJ includes a first Schottky junction portion SJ1 formed between the Schottky metal 16 and the high concentration layer 10 and a second Schottky junction portion SJ2 formed between the Schottky metal 16 and the low concentration layer 11.

It should be noted that it is preferable for the first Schottky junction portion SJ1 to be larger than the second Schottky junction portion SJ2 in a plan view. If so, it is possible to sufficiently reduce the barrier height.

Second Preferred Embodiment

Figure 8:
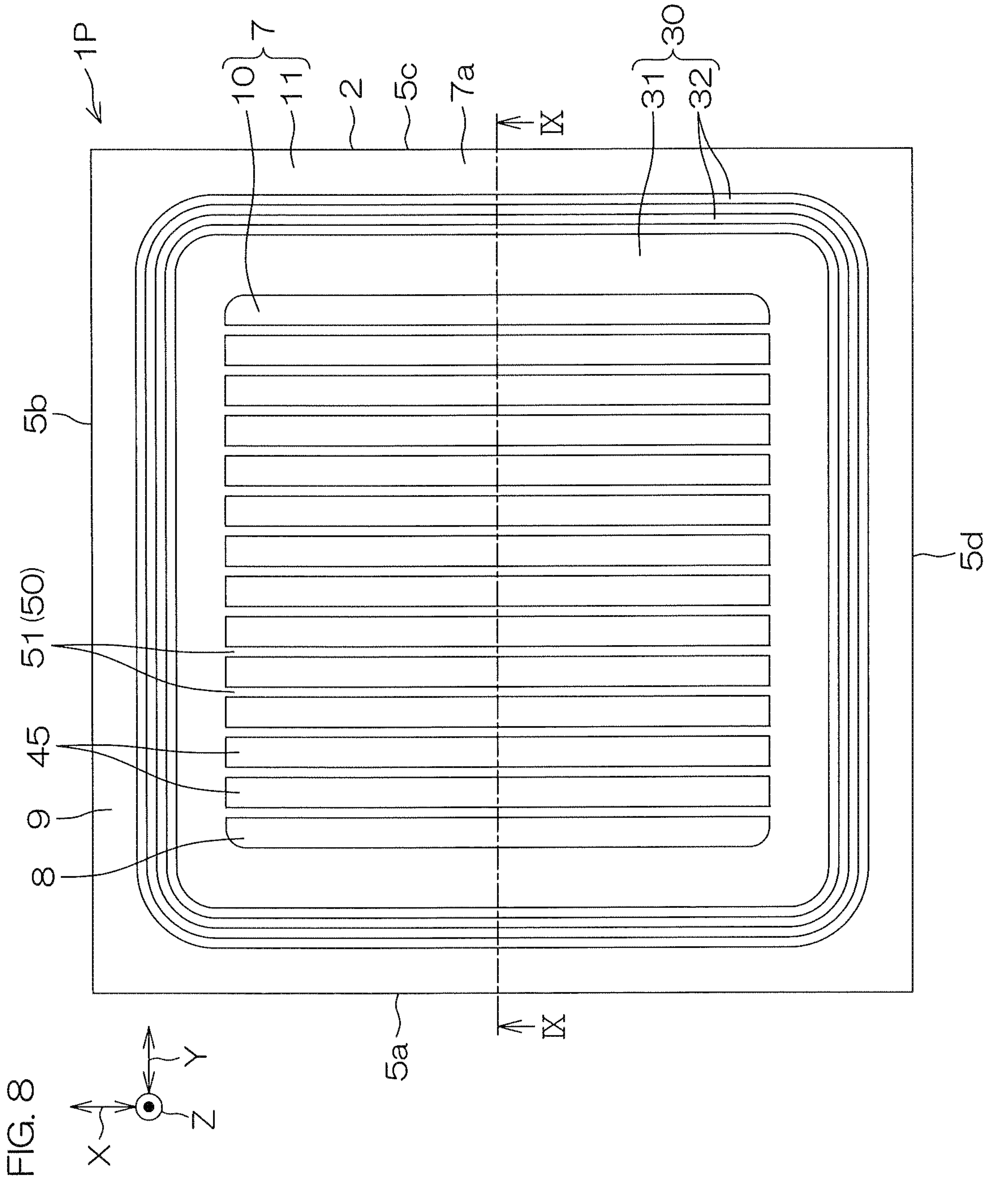
FIG. 8 is a plan view of a main portion of a Schottky barrier diode according to a second preferred embodiment.
Figure 9:
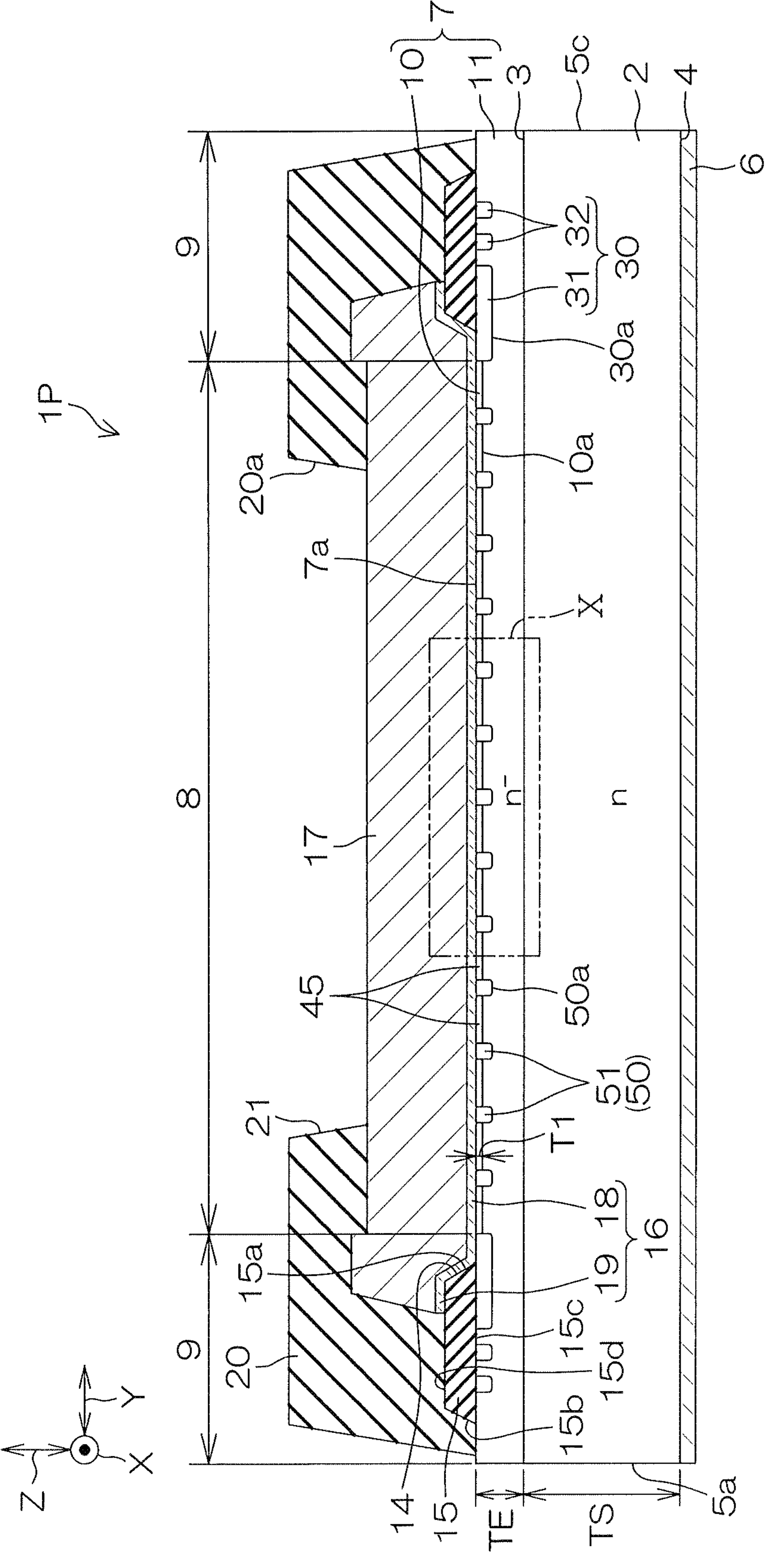
FIG. 9 is a cross-sectional view along line IX-IX shown in FIG. 8.
Figure 10:
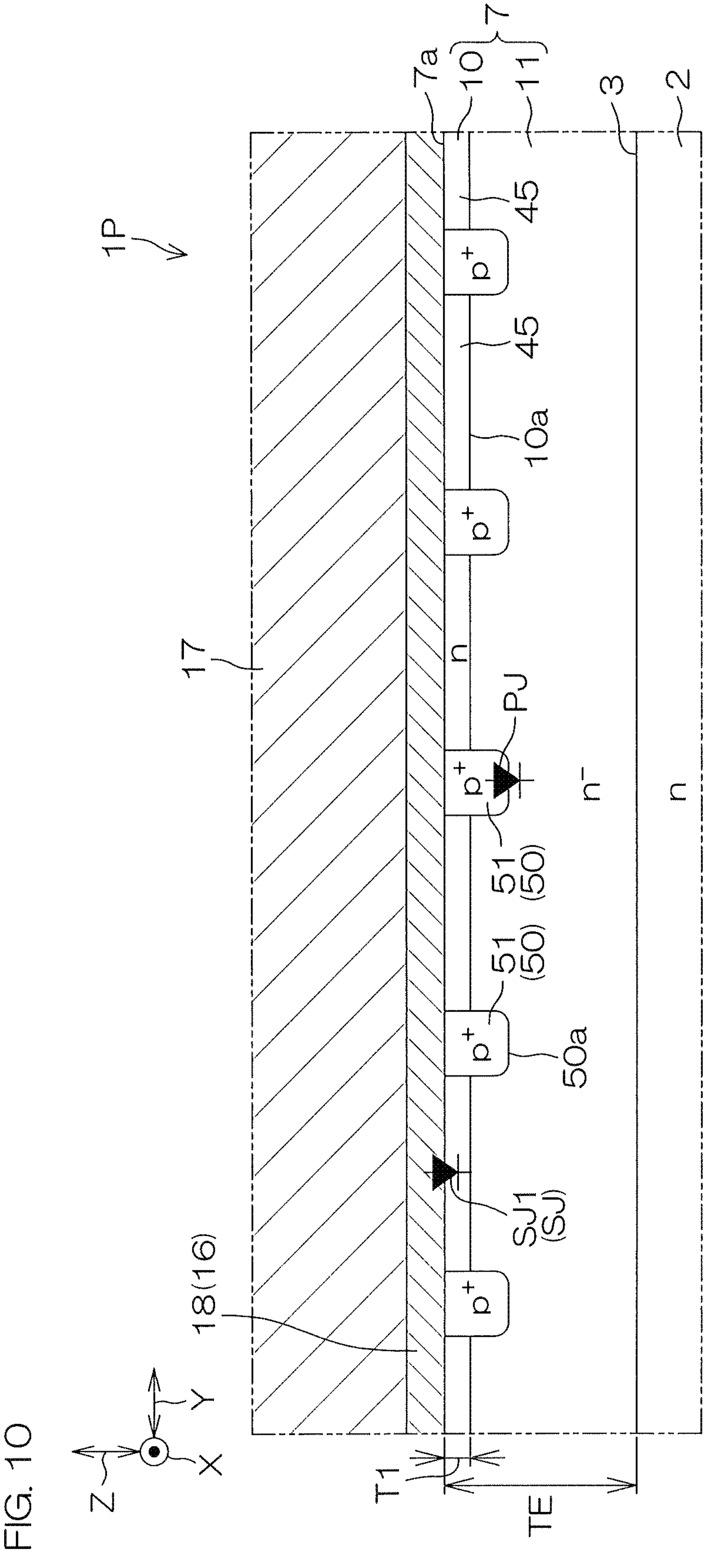
FIG. 10 is an enlarged view of region X shown in FIG. 9.

FIG. 8 is a plan view of a main portion of a Schottky barrier diode 1P according to a second preferred embodiment. FIG. 9 is a cross-sectional view along line IX-IX shown in FIG. 8. FIG. 10 is an enlarged view of region X shown in FIG. 9.

In FIG. 8 to FIG. 10, the same reference sign as in FIG. 1 to FIG. 7 mentioned above is given to a component equivalent to each component shown in FIG. 1 to FIG. 7, and a description of the component is omitted (the same applies to FIG. 11 and FIG. 12 mentioned later).

The Schottky barrier diode 1P additionally includes a $p^+$ type (second-conductivity-type) impurity region 50 that is formed at the surface layer portion of the surface 7*a* of the epitaxial layer 7 so as to be in contact with the Schottky metal 16 and that forms a pn junction portion PJ between the epitaxial layer 7 and the impurity region 50. The pn junction portion PJ is formed near a contact interface between the impurity region 50 and the epitaxial layer 7. The p type impurity concentration of the impurity region 50 is, for example, not less than $10\times10^{16}$ $cm^{-3}$ and not more than $10\times10^{21}$ $cm^{-3}$.

The high concentration layer 10 and the impurity region 50 are alternately disposed along the second direction Y in a plan view.

In detail, the high concentration layer 10 includes a plurality of linear regions 45 disposed in a stripe shape. The impurity region 50 includes a plurality of linear impurity regions 51 disposed in a stripe shape.

The linear regions 45 are disposed at equal intervals in the second direction Y, and each of the linear regions 45 extends in the first direction X. The linear regions 45 are in contact with the inward end portion of the guard region 30 (in the example of FIG. 8, in contact with the inward end portion of the first guard region 31).

The linear impurity regions 51 are disposed at equal intervals in the second direction Y, and each of the linear impurity regions 51 extends in the first direction X. The linear impurity regions 51 are integral with the first guard region 31. In detail, both end portions of the linear impurity region 51 in the first direction X are connected to the inward end portion of the first guard region 31, and a boundary between the linear impurity region 51 and the first guard region 31 does not exist.

A bottom portion 50*a* of the impurity region 50 (in the example of FIG. 9, a bottom portion of the linear impurity region 51) is flush with the bottom portion 30*a* of the guard region 30, and is positioned on the side opposite to the surface 7*a* of the epitaxial layer 7 with respect to the bottom portion 10*a* (bottom portion of the linear region 45) of the high concentration layer 10.

According to the second preferred embodiment, the same effect as in the first preferred embodiment is fulfilled. In other words, it is possible to reduce the barrier height.

According to the second preferred embodiment, both the Schottky junction portion SJ and the pn junction portion PJ are disposed in the Schottky barrier diode 1P. Therefore, a depletion layer is formed around the pn junction portion PJ when a reverse voltage is applied, hence restraining a leakage current that flows from the cathode electrode 6 toward the anode electrode 17. Therefore, it is possible to sufficiently restrain a leakage current even if the n type impurity concentration of the high concentration layer 10 is raised so as to reduce the barrier height.

It is possible to manufacture the Schottky barrier diode 1P by the same manufacturing method (see FIG. 5) as the manufacturing method of the Schottky barrier diode 1 according to the first preferred embodiment. It should be noted that the impurity region 50 is formed simultaneously with the guard region 30.

Next, a first modification example (see FIG. 11) and a second modification example (see FIG. 12) of the Schottky barrier diode 1P of the second preferred embodiment will be described.

Figure 11:
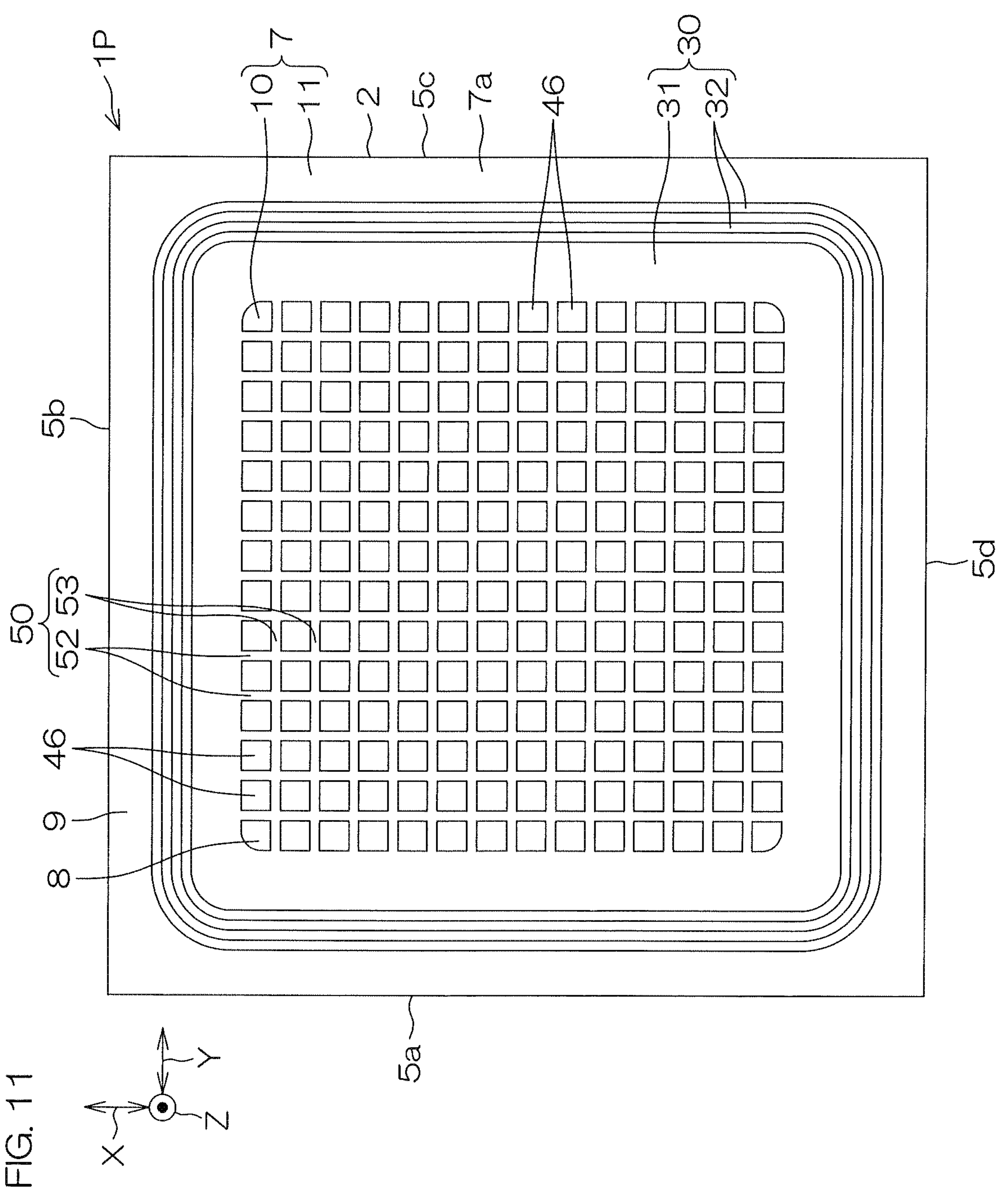
FIG. 11 is a plan view of a main portion of a Schottky barrier diode according to a first modification example of the second preferred embodiment.

As shown in FIG. 11, the impurity region 50 of the Schottky barrier diode 1P may be formed in a mesh shape so as to partition the high concentration layer 10 in a matrix manner in a plan view. In detail, the high concentration layer 10 is constituted of a plurality of unit regions 46 disposed in a matrix manner and surrounded by the impurity region 50. The impurity region 50 is constituted of a plurality of first extensional impurity regions 52 extending in the first direction X and a plurality of second extensional impurity regions 53 extending in the second direction Y.

Figure 12:
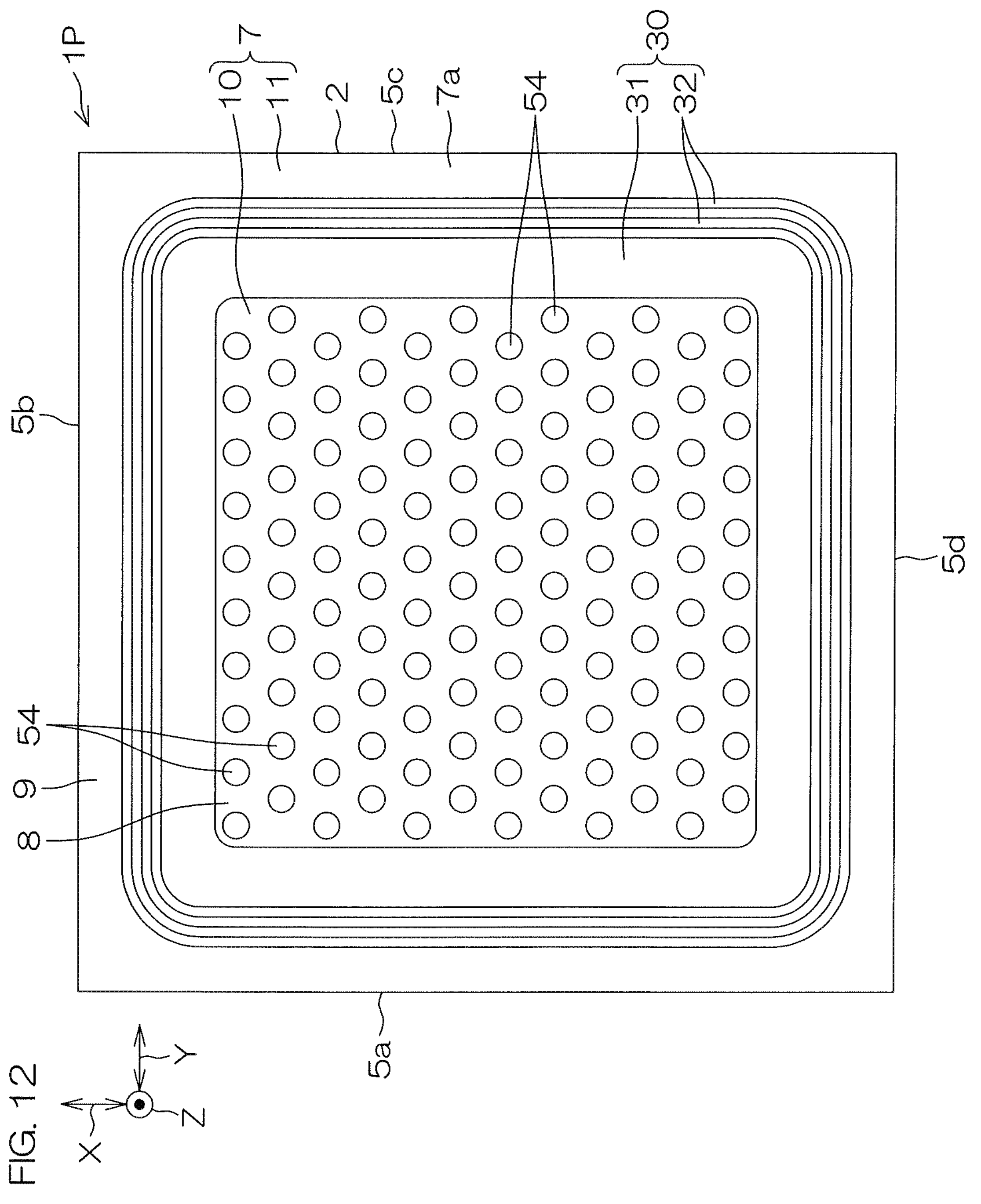
FIG. 12 is a plan view of a main portion of a Schottky barrier diode according to a second modification example of the second preferred embodiment.

As shown in FIG. 12, the impurity region 50 of the Schottky barrier diode 1P may include a plurality of dotted impurity regions 54 disposed in a staggered manner in the active region 8 in a plan view. In the example of FIG. 12, the dotted impurity region 54 has a circular shape in a plan view. The dotted impurity region 54 may have a polygonal shape in a plan view.

Third Preferred Embodiment

Figure 13:
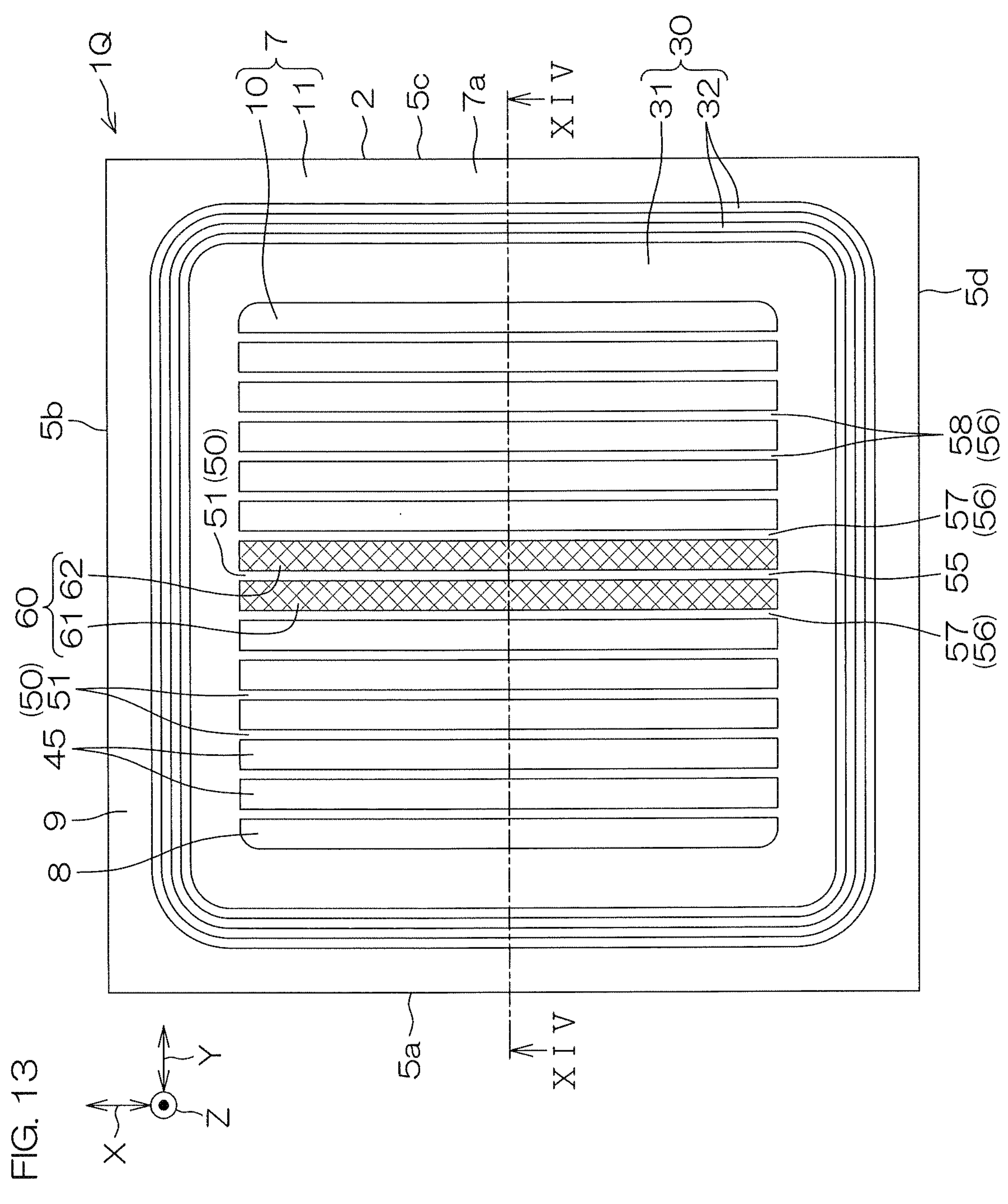
FIG. 13 is a plan view of a main portion of a Schottky barrier diode according to a third preferred embodiment.
Figure 14:
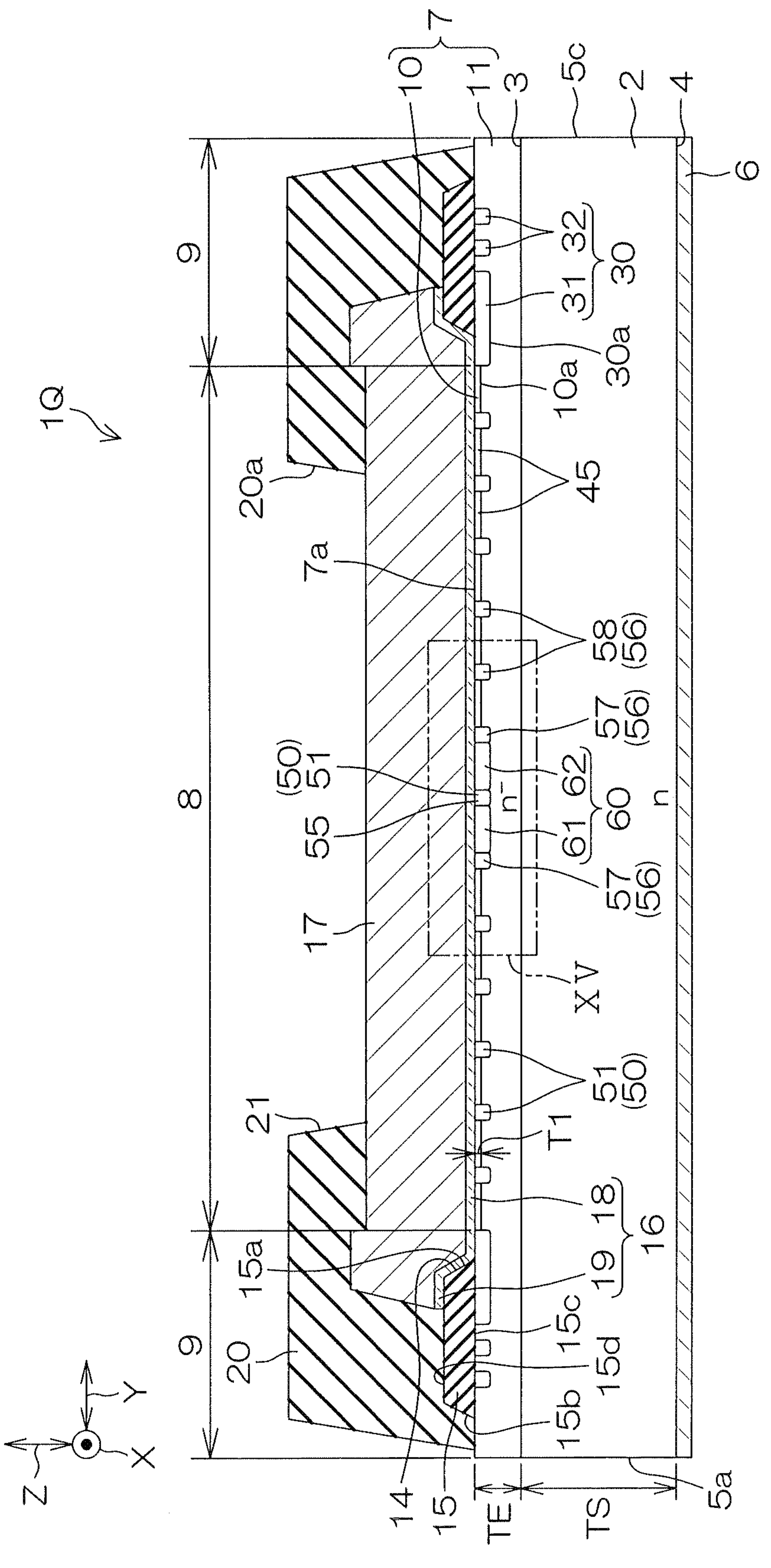
FIG. 14 is a cross-sectional view along line XIV-XIV shown in FIG. 13.
Figure 15:
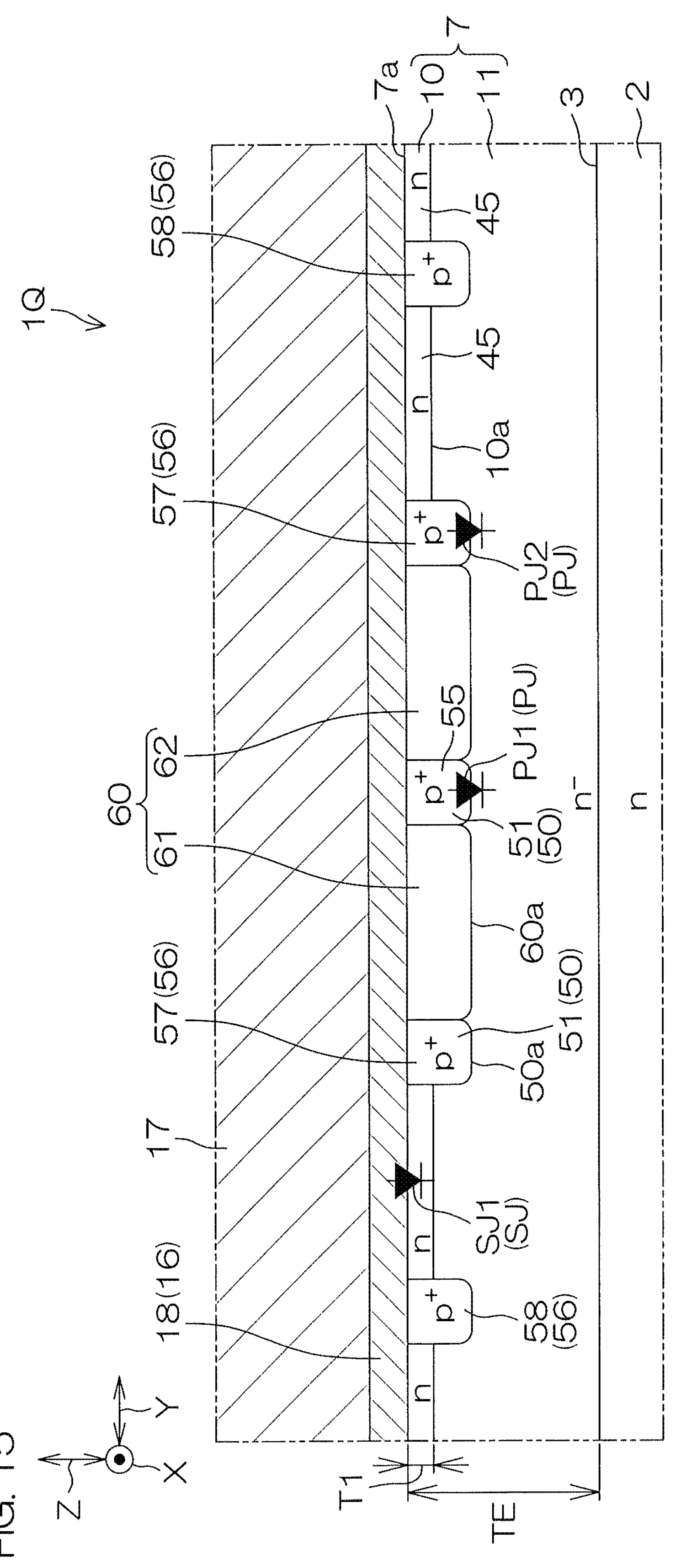
FIG. 15 is an enlarged view of region XV shown in FIG. 14.

FIG. 13 is a plan view of a main portion of a Schottky barrier diode 1Q according to a third preferred embodiment. FIG. 14 is a cross-sectional view along line XIV-XIV shown in FIG. 13. FIG. 15 is an enlarged view of region XV shown in FIG. 14.

In FIG. 13 to FIG. 15, the same reference sign as in FIG. 1 to FIG. 12 mentioned above is given to a component equivalent to each component shown in FIG. 1 to FIG. 12, and a description of the component is omitted (the same applies to FIG. 16A to FIG. 22C mentioned later).

A point in which the Schottky barrier diode 1Q according to the third preferred embodiment chiefly differs from the Schottky barrier diode 1P according to the second preferred embodiment is that a lattice defect region 60 that is larger in the number of lattice defects than the epitaxial layer 7 is formed at the surface layer portion of the epitaxial layer 7.

The lattice defect region 60 is a region formed by injecting rare gas atoms, such as argon (Ar), into the epitaxial layer 7. Therefore, the lattice defect region 60 is referred to also as a rare-gas containing region. The impurity concentration of the lattice defect region 60 is, for example, not less than $10\times10^{19}$ $cm^{-3}$ and not more than $10\times10^{21}$ $cm^{-3}$.

The lattice defect region 60 is in contact with the Schottky metal 16. Rare gas atoms are injected into the epitaxial layer 7, and, as a result, a SiC crystal lattice forming the epitaxial layer 7 is broken down, and a lattice defect occurs. Therefore, the lattice defect region 60 does not form a Schottky junction portion between the Schottky metal 16 and the lattice defect region 60 in spite of the fact that it is in contact with the Schottky metal 16, and the lattice defect region 60 obstructs the flow of an electric current from the Schottky metal 16 to the epitaxial layer 7. In other words, the lattice defect region 60 has more lattice defects than the epitaxial layer 7, and hence is a high-resistance layer that is higher in resistance than the epitaxial layer 7.

The lattice defect region 60 is disposed around one of the linear impurity regions 51.

In detail, the impurity region 50 includes an inner impurity region 55 disposed inside the lattice defect region 60 so as to be in contact with the lattice defect region 60 and an outer impurity region 56 disposed outside the lattice defect region 60. The linear impurity region 51 positioned inside the lattice defect region 60 of the linear impurity regions 51 functions as the inner impurity region 55, and the linear impurity region 51 positioned outside the lattice defect region 60 of the linear impurity regions 51 functions as the outer impurity region 56. The inner impurity region 55 is interposed between both the lattice defect regions 60 in the second direction Y.

The outer impurity region 56 includes a pair of outer contact impurity regions 57 disposed on the side opposite to the inner impurity region 55 with the lattice defect region 60 between the outer contact impurity regions 57 so as to be in contact with the lattice defect region 60 and a plurality of outer noncontact impurity regions 58 disposed on the side opposite to the inner impurity region 55 with the lattice defect region 60 between the outer noncontact impurity regions 58 so as to be away from the lattice defect region 60.

The lattice defect regions 60 are in contact with the inner impurity region 55 from both sides in the second direction Y. In the example of FIG. 13, both end portions of the lattice defect region 60 in the first direction X are in contact with the inward end of the first guard region 31. Unlike the example of FIG. 13, both end portions of the lattice defect region 60 in the first direction X may face the first guard region 31 through the low concentration layer 11 without being in contact with the inward end of the first guard region 31.

The lattice defect region 60 includes a first lattice defect region 61 that linearly extends in the first direction X and that is in contact with the inner impurity region 55 from one side in the second direction Y and a second lattice defect region 62 that linearly extends in the first direction X and that is in contact with the inner impurity region 55 from the other side in the second direction Y.

The outer contact impurity region 57 on one side in the second direction Y is interposed between the first lattice defect region 61 and the linear region 45 of the high concentration layer 10 in a plan view. The outer contact impurity region 57 on the other side in the second direction Y is interposed between the second lattice defect region 62 and the linear region 45 of the high concentration layer 10 in a plan view.

The bottom portion of each of the linear impurity regions 51 (the bottom portion 50*a* of the impurity region 50) is in contact with the epitaxial layer 7. The bottom portion of each of the linear impurity regions 51 includes a pair of curved portions toward a reverse surface of the epitaxial layer 7 and a flat portion that connects the curved portions together.

A bottom portion 60*a* of the lattice defect region 60 is in contact with the low concentration layer 11. The bottom portion 60*a* of the lattice defect region 60 includes a pair of curved portions toward the reverse surface of the epitaxial layer 7 and a flat portion that connects the curved portions together. The flat portion of the bottom portion 60*a* of the lattice defect region 60 is formed so as to be flush with the flat portion of a bottom portion 55*a* of the inner impurity region 55 and with the flat portion of a bottom portion 57*a* of the outer contact impurity region 57.

According to the third preferred embodiment, the same effect as in the first and second preferred embodiments is fulfilled.

Here, in a configuration in which the lattice defect region 60 is not disposed as in the Schottky barrier diode 1P according to the second preferred embodiment, minority carriers are implanted from the pn junction PJ into the epitaxial layer 7 when a forward overcurrent is applied. This lowers the resistance of the epitaxial layer 7, and therefore it is possible to restrain the heat release value and to raise surge withstand capacity. However, if the thickness TE of the epitaxial layer 7 is large, a drop in voltage caused by the epitaxial layer 7 becomes large, and a voltage applied to the pn junction portion PJ becomes small.

Figure 16A:
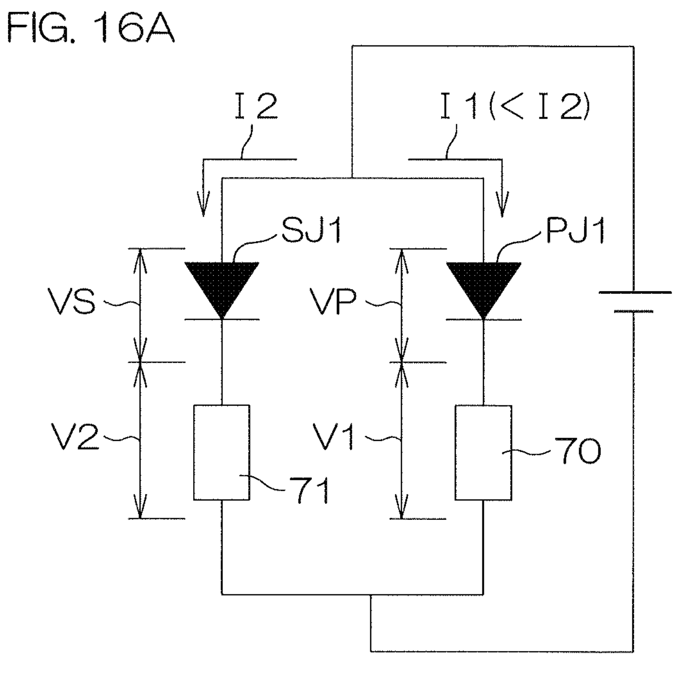
FIG. 16A is a circuit diagram shown to describe a voltage drop around an inner impurity region that is included in the Schottky barrier diode according to the third preferred embodiment.

Therefore, it is possible to prevent an electric current I1 from flowing into the lattice defect region 60 and to make the electric current I1 smaller than an electric current I2 flowing into the Schottky junction portion SJ1 by providing the lattice defect region 60 as in the third preferred embodiment. Hence, a voltage drop V1 caused by a first nearby part 70, which is positioned near the lattice defect region 60, of the epitaxial layer 7 is reduced as shown in FIG. 16A, and is made smaller than a second nearby part 71, which is positioned near the Schottky junction SJ1, of the epitaxial layer 7.

Therefore, a voltage drop in a part, which is positioned near the inner impurity region 55, of the epitaxial layer 7 is also reduced in the same way as the voltage drop V1 caused by the first nearby part 70. Therefore, it is possible to make a potential difference VP applied to the pn junction portion PJ1 formed between the inner impurity region 55 and the epitaxial layer 7 larger than a potential difference VS applied to the Schottky junction portion SJ1. Therefore, it is possible to sufficiently secure the potential difference VP applied to the pn junction portion PJ1 formed between the inner impurity region 55 and the epitaxial layer 7. Therefore, it is possible to raise the surge withstand capability.

Figure 16B:
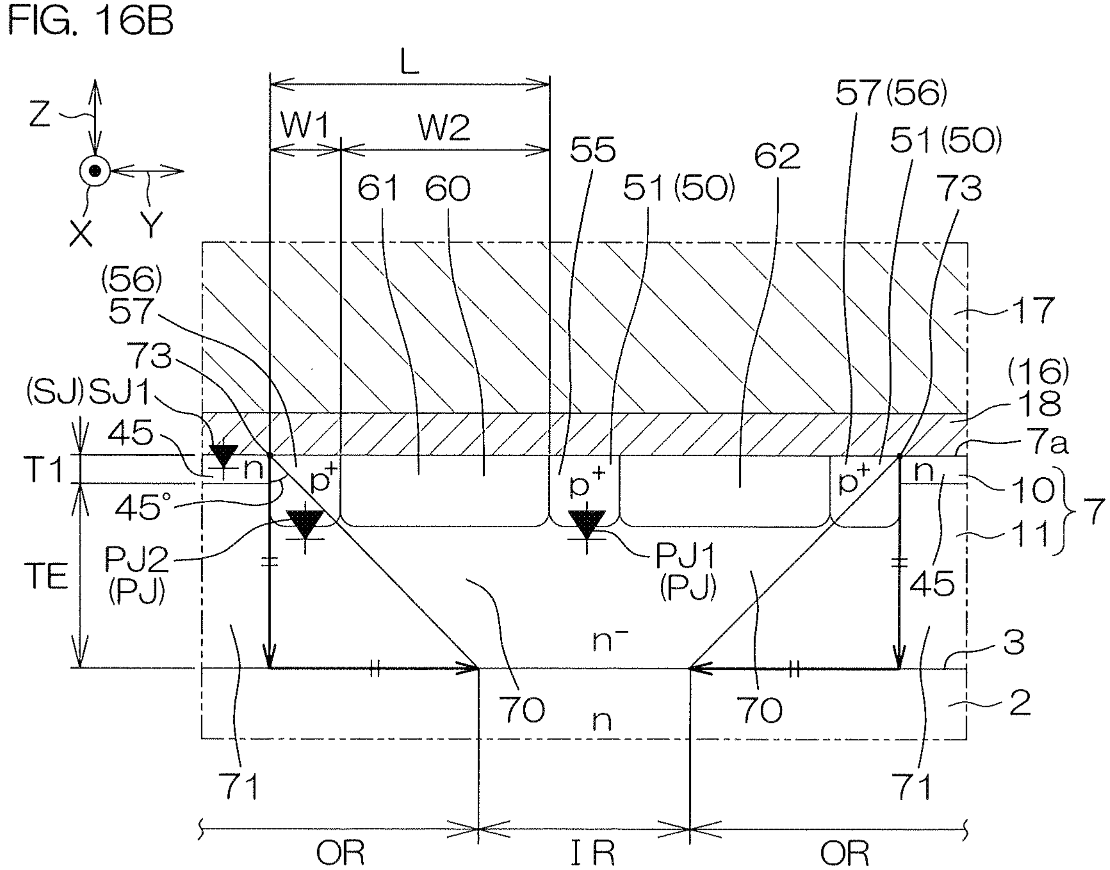
FIG. 16B is a cross-sectional view shown to describe the voltage drop around the inner impurity region.

If a distance L between the Schottky junction portion SJ1 and the inner impurity region 55 is larger than the thickness TE of the epitaxial layer 7 as shown in FIG. 16B, it is possible to further prevent an electric current from flowing into the part, which is positioned between the inner impurity region 55 and the semiconductor substrate 2, of the epitaxial layer 7.

The distance L between the Schottky junction portion SJ1 and the inner impurity region 55 is equivalent to the sum of a width W1 of the outer contact impurity region 57 and a width W2 of the first lattice defect region 61 (width of the second lattice defect region 62).

A region inward from a position fixed by being moved from a boundary 73 between the Schottky junction portion SJ1 and the pn junction portion PJ2 toward the inner impurity region 55 side by the same width as the thickness TE of the epitaxial layer 7 is defined as an inside region IR, and a region outward from the inside region IR is defined as an outside region OR. In the inside region IR, an electric current flowing into the epitaxial layer 7 is effectively restrained by the lattice defect region 60. If the distance L between the Schottky junction portion SJ and the inner impurity region 55 is larger than the thickness TE of the epitaxial layer 7, the inside region IR is set at the epitaxial layer 7. In other words, if the distance L between the Schottky junction portion SJ and the inner impurity region 55 is larger than the thickness TE of the epitaxial layer 7, the first nearby part 70 is positioned in the inside region IR.

Figure 17:
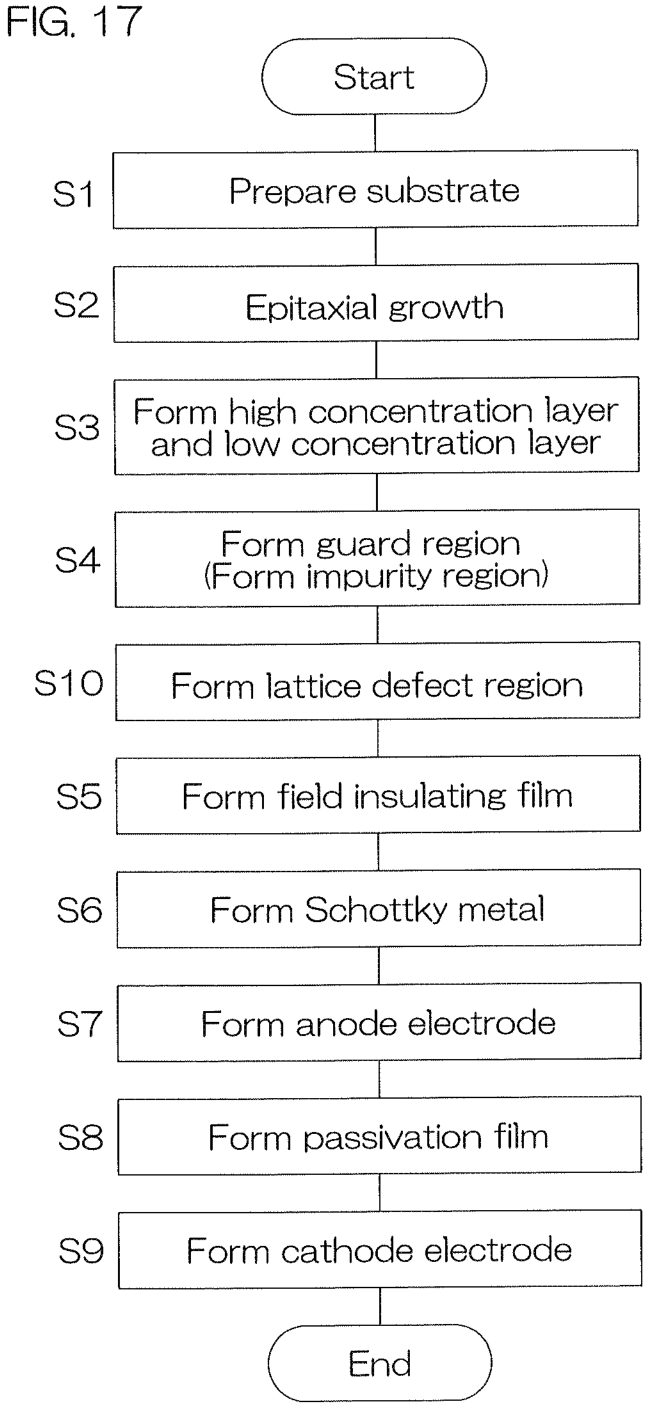
FIG. 17 is a flowchart of a method of manufacturing the Schottky barrier diode according to the third preferred embodiment.

Next, a method of manufacturing the Schottky barrier diode 1Q will be described. FIG. 17 is a flowchart of a method of manufacturing the Schottky barrier diode 1Q according to the third preferred embodiment.

The method of manufacturing the Schottky barrier diode 1Q differs from the method of manufacturing the Schottky barrier diode 1 according to the first preferred embodiment, and the impurity region 50 is formed simultaneously with the guard region 30 (step S4), and, after the guard region 30 is formed, the lattice defect region 60 is formed (step S10). Thereafter, the field insulating film 15 is formed (step S5).

Figure 18A:
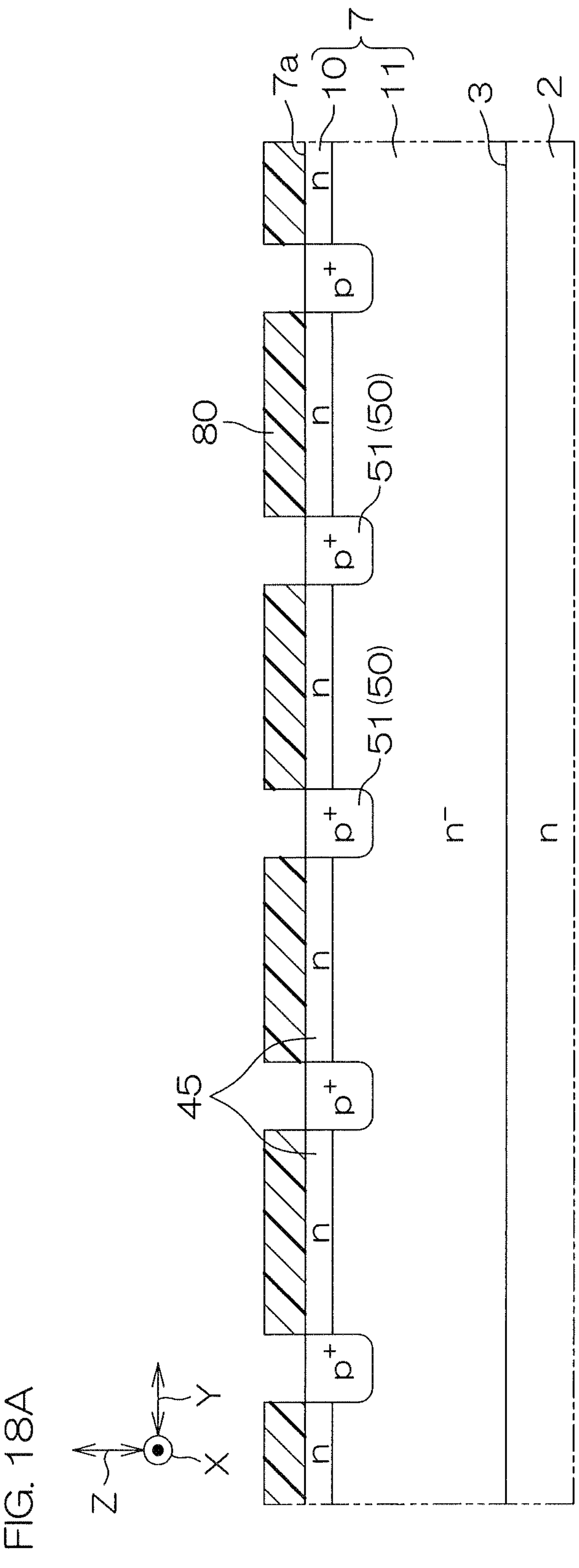
FIG. 18A is a schematic view shown to describe how an impurity region and a lattice defect region are formed in the method of manufacturing the Schottky barrier diode according to the third preferred embodiment.
Figure 18B:
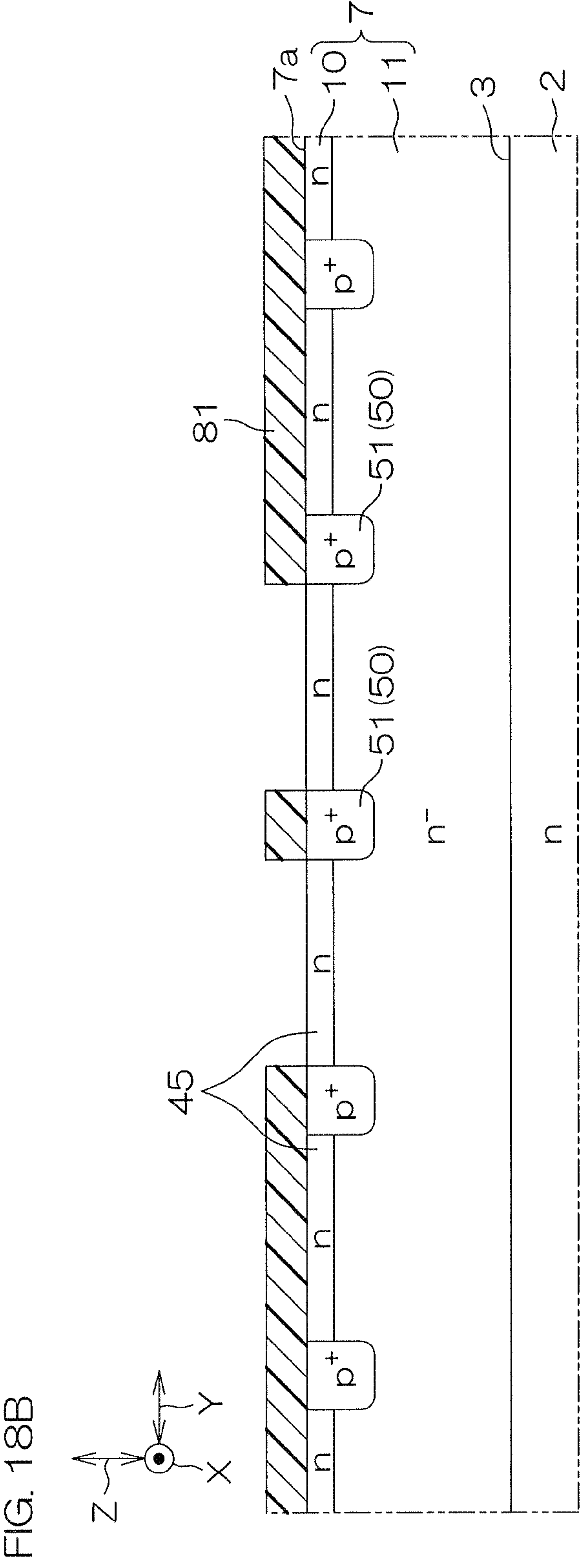
FIG. 18B is a schematic view shown to describe how the impurity region and the lattice defect region are formed.
Figure 18C:
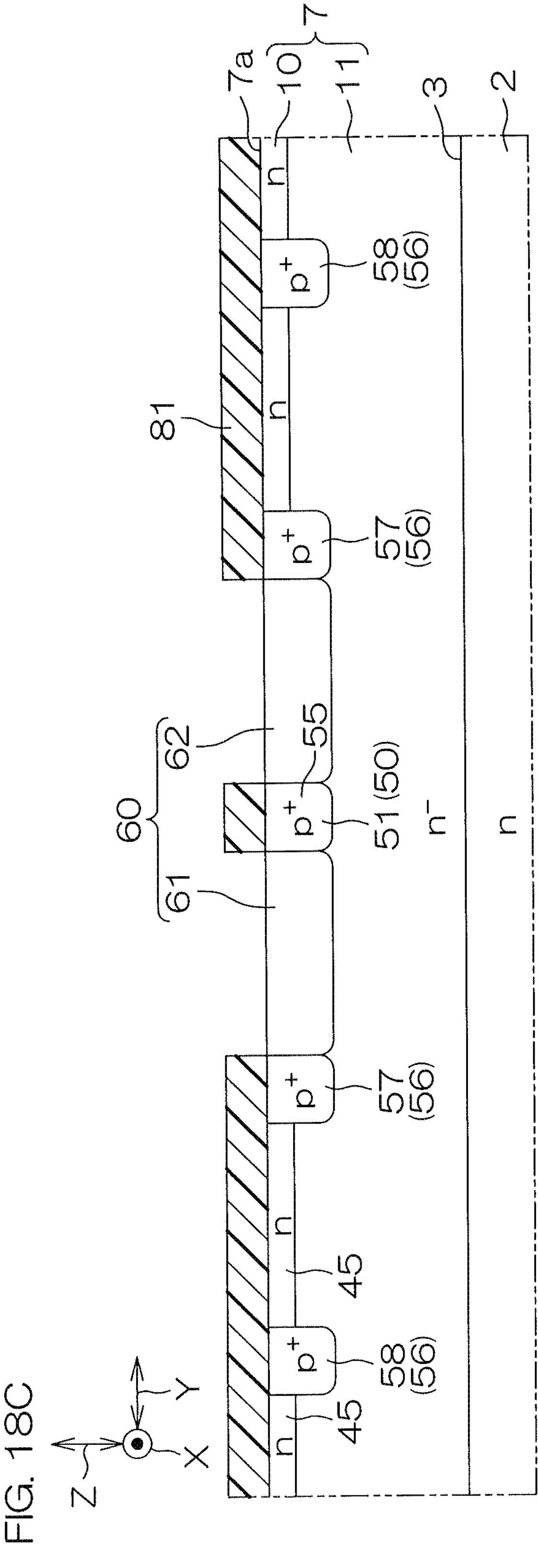
FIG. 18C is a schematic view shown to describe how the impurity region and the lattice defect region are formed.

Next, how the impurity region 50 and the lattice defect region 60 are formed will be described in detail. FIG. 18A to FIG. 18C are schematic views each of which is shown to describe how the impurity region 50 and the lattice defect region 60 are formed.

The high concentration layer 10 is formed at the surface layer portion of the epitaxial layer 7, and then a resist mask 80 having a predetermined pattern is formed on the epitaxial layer 7 as shown in FIG. 18A. The impurity region 50 (the linear impurity regions 51) is formed together with the guard region 30 (see FIG. 14) by implanting a p type impurity into a part, which is not covered by the resist mask 80, of the surface layer portion of the epitaxial layer 7 according to an ion implantation method (step S4). Thereafter, the resist mask 80 is removed.

After the resist mask 80 is removed, a resist mask 81 having a pattern by which a region in which the lattice defect region 60 is to be formed is exposed and by which other regions are covered is formed on the epitaxial layer 7 as shown in FIG. 18B.

In detail, the resist mask 81 exposes both sides of the linear impurity region 51 that serves as a base for the inner impurity region 55 in the surface layer portion of the epitaxial layer 7. Next, the lattice defect region 60 is formed at both sides of the linear impurity region 51 that serves as a base for the inner impurity region 55 by implanting rare gas atoms into a part, which is not covered by the resist mask 81, of the surface layer portion of the surface 7*a* of the epitaxial layer 7 according to the ion implantation method as shown in FIG. 18C (step S10). Hence, the inner impurity region 55 is formed.

Thereafter, the resist mask 81 is removed, and the field insulating film 15 is formed on the epitaxial layer 7 (step S5).

Next, a first modification example and a second modification example of the Schottky barrier diode 1Q will be described with reference to FIG. 19 to FIG. 22C.

Figure 19:
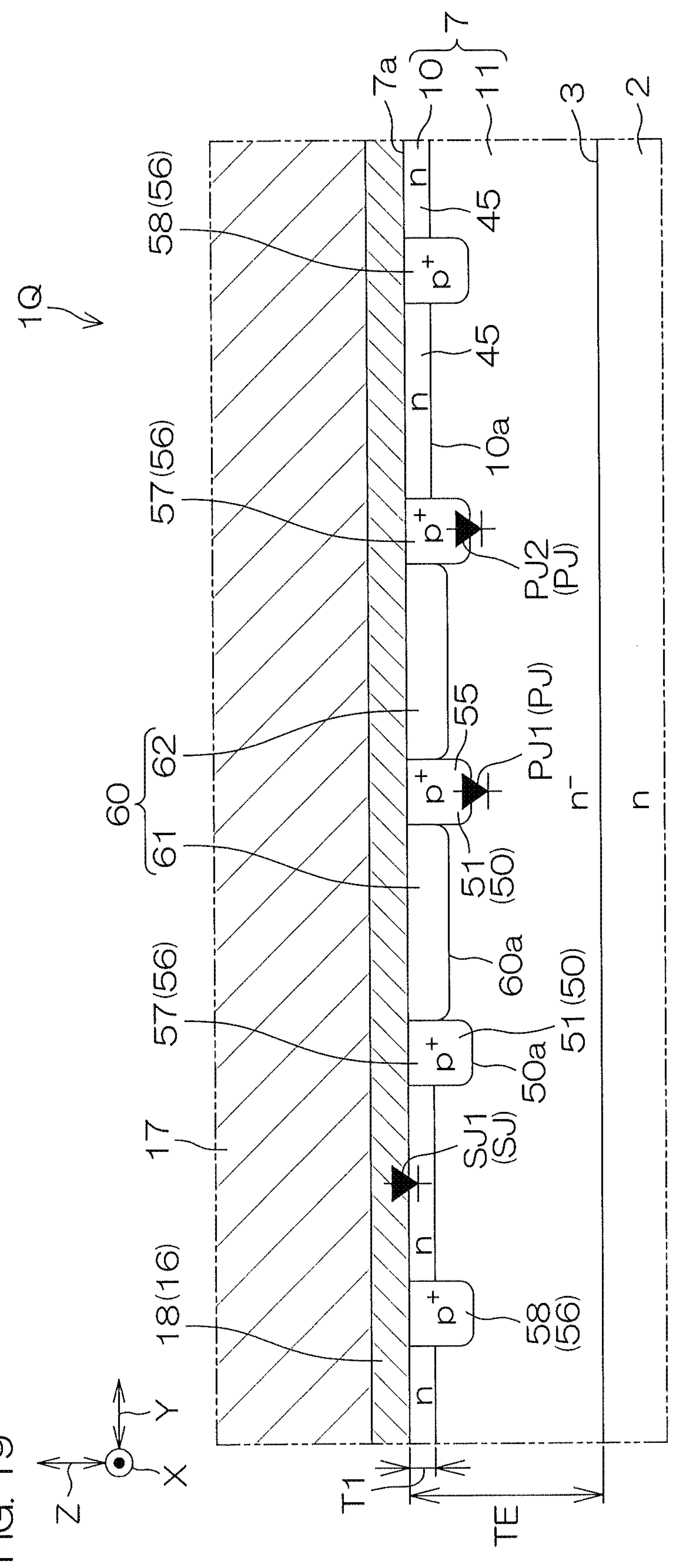
FIG. 19 is a cross-sectional view of a first modification example of the Schottky barrier diode according to the third preferred embodiment.

FIG. 19 is an enlarged cross-sectional view of a Schottky barrier diode 1Q according to the first modification example. FIG. 19 is a cross-sectional view of the same part as in FIG. 14. In FIG. 19, the same reference sign as in FIG. 1 to FIG. 18C mentioned above is given to a component equivalent to each component shown in FIG. 1 to FIG. 18C, and a description of the component is omitted. In the Schottky barrier diode 1Q according to the first modification example, the bottom portion 60*a* of the lattice defect region 60 is positioned closer to the surface 7*a* of the epitaxial layer 7 than to the bottom portion 50*a* of the impurity region 50. The bottom portion 60*a* of the lattice defect region 60 is in contact with the low concentration layer 11. The Schottky barrier diode 1Q according to the first modification example can be manufactured by the same manufacturing method as the manufacturing method mentioned above (see FIG. 17 to FIG. 18C).

Figure 20:
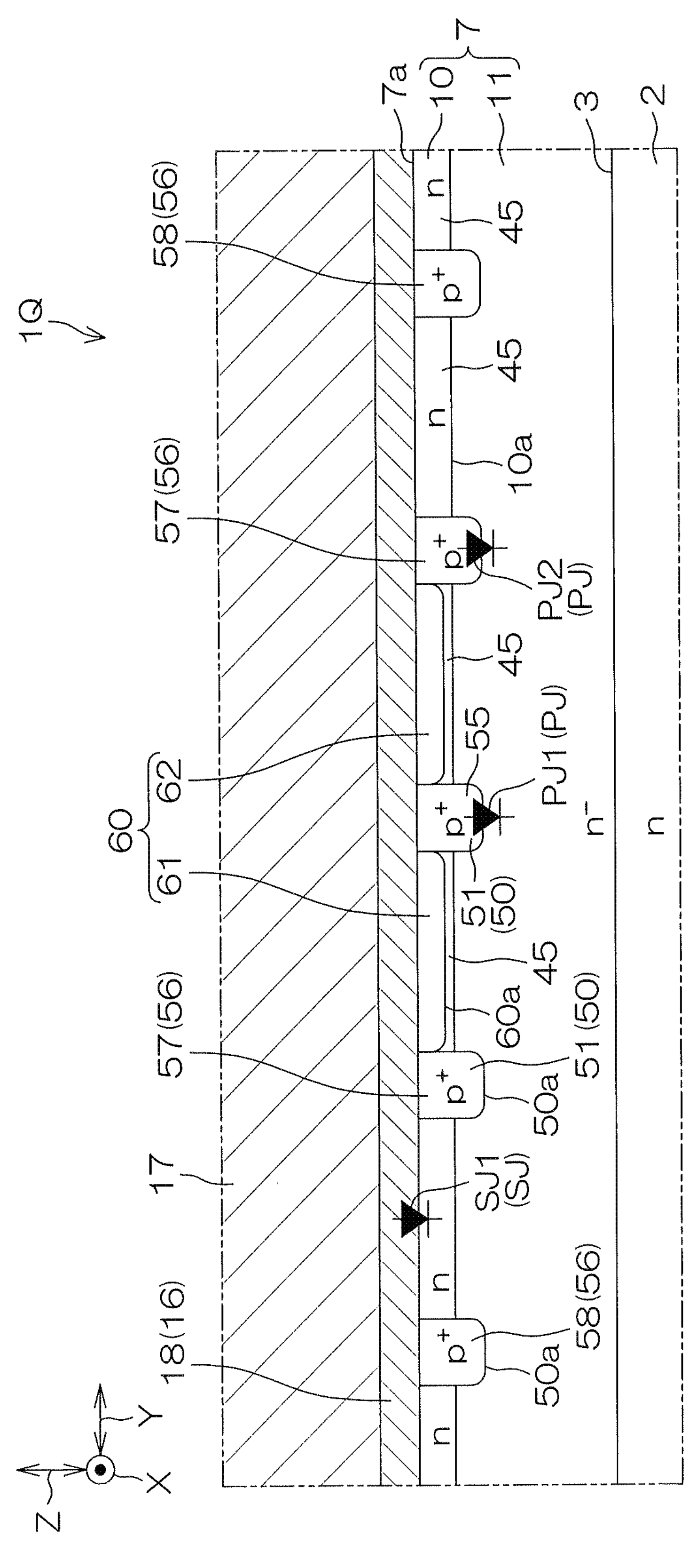
FIG. 20 is a cross-sectional view of a second modification example of the Schottky barrier diode according to the third preferred embodiment.

FIG. 20 is an enlarged cross-sectional view of a Schottky barrier diode 1Q according to the second modification example. FIG. 20 is a cross-sectional view of the same part as in FIG. 14. In FIG. 20, the same reference sign as in FIG. 1 to FIG. 19 mentioned above is given to a component equivalent to each component shown in FIG. 1 to FIG. 19, and a description of the component is omitted.

In the Schottky barrier diode 1Q according to the second modification example, the bottom portion 60*a* of the lattice defect region 60 is positioned closer to the surface 7*a* of the epitaxial layer 7 than to the bottom portion 10*a* of the high concentration layer 10, and the bottom portion 60*a* of the lattice defect region 60 is in contact with to the linear region 45 of the high concentration layer 10. The Schottky barrier diode 1Q according to the second modification example can be manufactured by the same manufacturing method as the manufacturing method mentioned above (see FIG. 17 to FIG. 18C).

Figure 21:
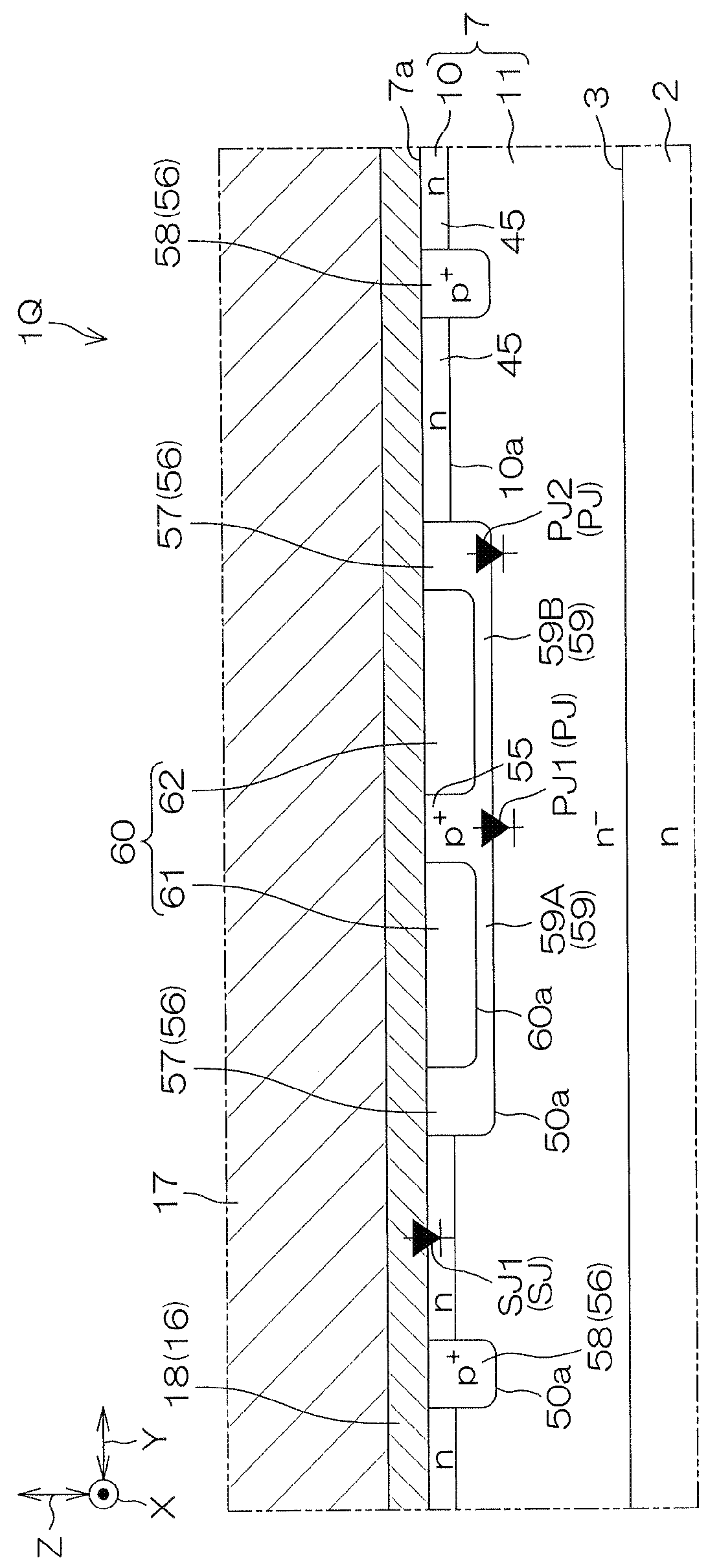
FIG. 21 is a cross-sectional view of a third modification example of the Schottky barrier diode according to the third preferred embodiment.

FIG. 21 is an enlarged cross-sectional view of a third modification example of the Schottky barrier diode 1Q according to the third preferred embodiment.

In the Schottky barrier diode 1Q according to the third modification example, the bottom portion 60*a* of the lattice defect region 60 is positioned closer to the surface 7*a* of the epitaxial layer 7 than to the bottom portion 50*a* of the impurity region 50, and the impurity region 50 is in contact with the bottom portion 60*a* of the lattice defect region 60 as shown in FIG. 21. In other words, the impurity region 50 includes a bottom-side impurity region 59 in contact with the bottom portion 60*a* of the lattice defect region 60. A bottom portion of the bottom-side impurity region 59 is in contact with the epitaxial layer 7.

The bottom-side impurity region 59 is formed integrally with the outer contact impurity region 57 and with the inner impurity region 55. In more detail, the bottom-side impurity region 59 is disposed at both sides of the inner impurity region 55 in the second direction Y. The bottom-side impurity region 59 includes a first bottom-side impurity region 59A, which extends between the outer contact impurity region 57 positioned on one side of the inner impurity region 55 and the inner impurity region 55 and which is in contact with a bottom portion of the first lattice defect region 61, and a second bottom-side impurity region 59B, which extends between the outer contact impurity region 57 positioned on the other side of the inner impurity region 55 and the inner impurity region 55 and which is in contact with a bottom portion of the second lattice defect region 62.

Figure 22A:
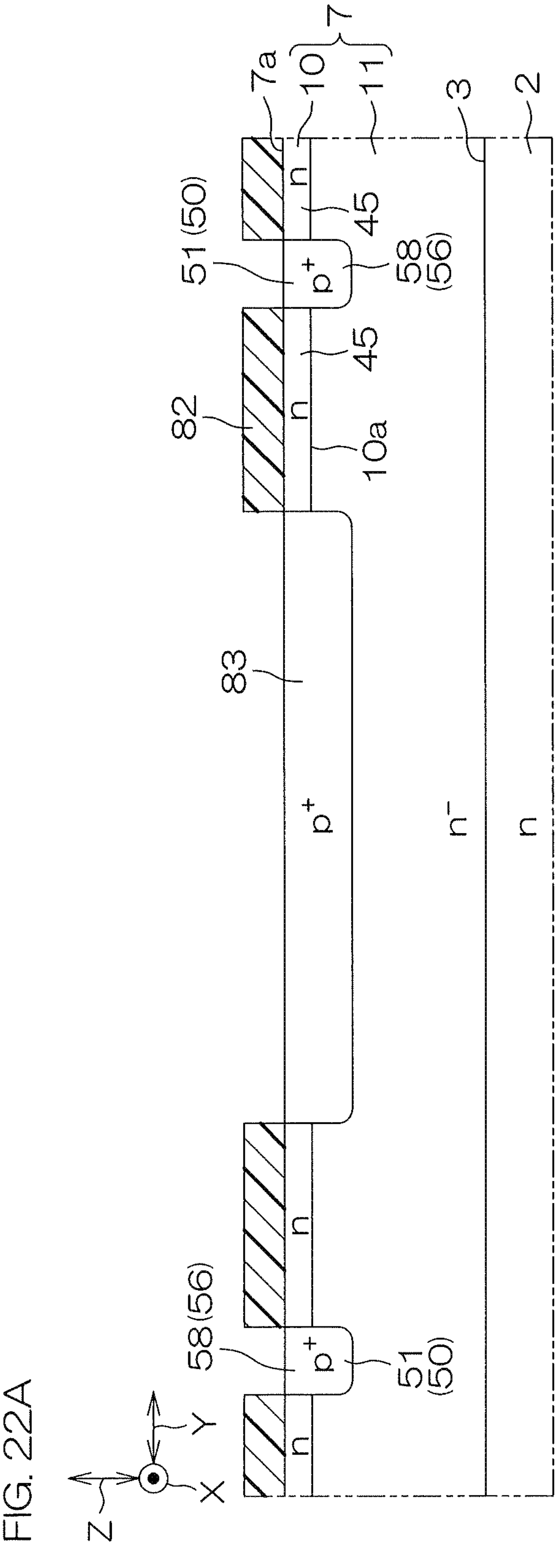
FIG. 22A is a schematic view shown to describe how the impurity region and the lattice defect region are formed in a method of manufacturing the Schottky barrier diode of the third modification example of the third preferred embodiment.
Figure 22B:
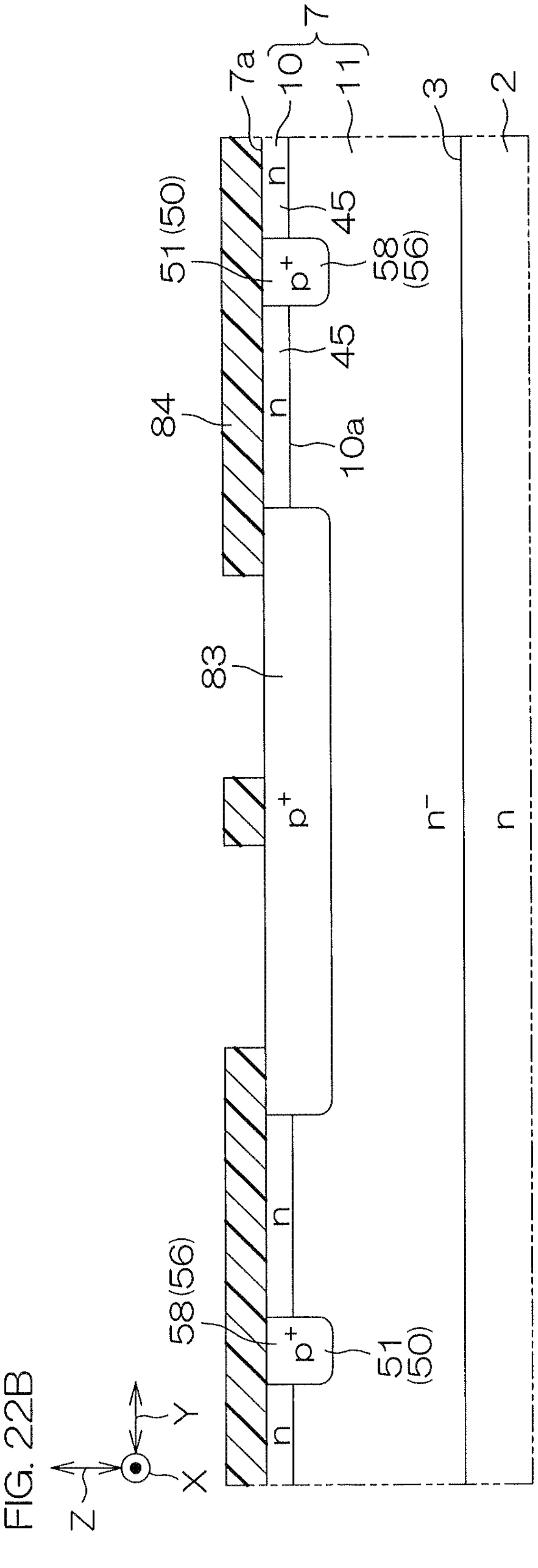
FIG. 22B is a schematic view shown to describe how the impurity region and the lattice defect region are formed in the method of manufacturing the Schottky barrier diode of the third modification example of the third preferred embodiment.
Figure 22C:
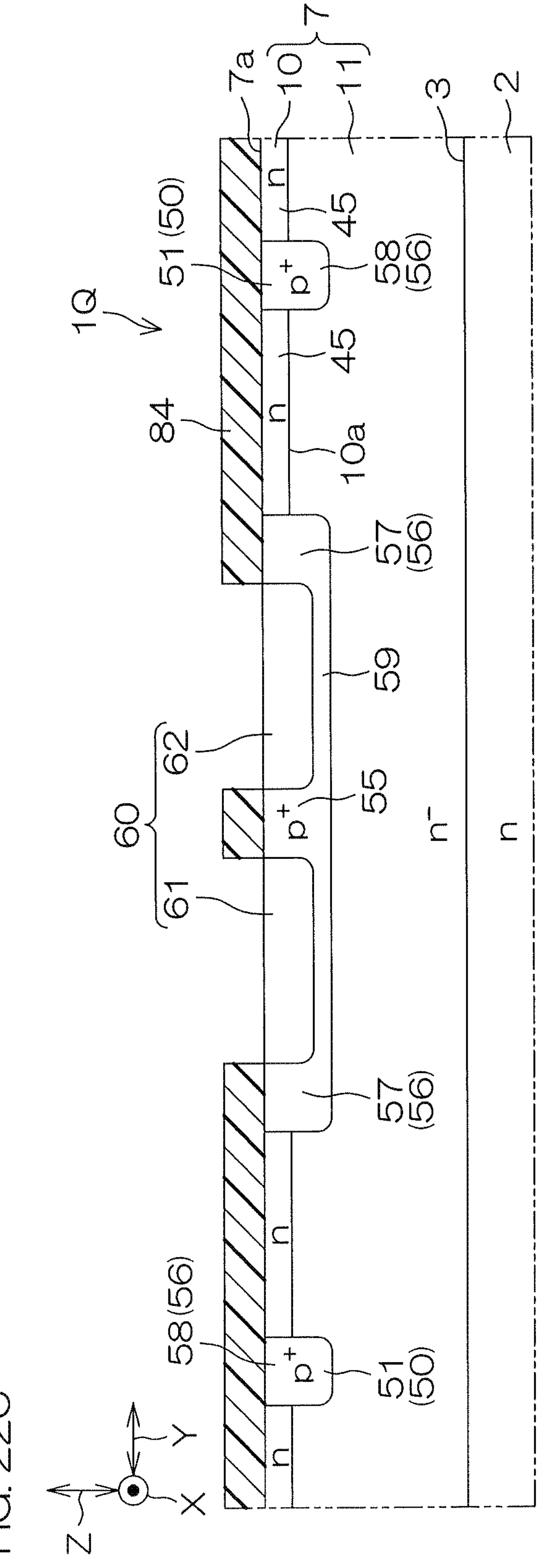
FIG. 22C is a schematic view shown to describe how the impurity region and the lattice defect region are formed in the method of manufacturing the Schottky barrier diode of the third modification example of the third preferred embodiment.

The manufacturing method of the Schottky barrier diode 1Q according to the third modification example differs slightly from the aforementioned manufacturing method (FIG. 17 to FIG. 18C). FIG. 22A to FIG. 22C are schematic views each of which is shown to describe how the impurity region 50 and the lattice defect region 60 are formed in the method of manufacturing the Schottky barrier diode 1Q according to the third modification example.

As shown in FIG. 22A, the epitaxial layer 7 is formed at the first principal surface 3 of the semiconductor substrate 2, and then a resist mask 82 having a predetermined pattern is formed on the epitaxial layer 7. The guard region 30 (see FIG. 14) and the impurity region 50 (the linear impurity regions 51) are formed by implanting a p type impurity into a part, which is not covered by the resist mask 82, of the surface layer portion of the epitaxial layer 7 according to the ion implantation method (step S4). In detail, the outer noncontact impurity regions 58 and a first base impurity region 83 that serves as a base for the inner impurity region 55 and for the pair of outer contact impurity regions 57 are formed.

Thereafter, the resist mask 82 is removed. After the resist mask 82 is removed, a resist mask 84 having a pattern by which a region in which the lattice defect region 60 is to be formed is exposed and by which other regions are covered is formed on the epitaxial layer 7 as shown in FIG. 22B. In detail, the resist mask 84 covers a central portion of the first base impurity region 83 and both end portions of the first base impurity region 83 in the second direction Y.

Next, the lattice defect region 60 is formed at both sides of a part, which serves as a base for the inner impurity region 55, of the first base impurity region 83 by implanting rare gas atoms into a part, which is not covered by the resist mask 84, of the surface layer portion of the surface 7*a* of the epitaxial layer 7 according to the ion implantation method as shown in FIG. 22C (step S10). Hence, the inner impurity region 55, the outer contact impurity region 57, and the bottom-side impurity region 59 are formed.

Thereafter, the resist mask 84 is removed, and the field insulating film 15 is formed on the epitaxial layer 7 (step S5).

Other Preferred Embodiments

For example, each of the preferred embodiments (first to third preferred embodiments) can be appropriately combined together.

In detail, in the Schottky barrier diode 1P of the second preferred embodiment, the high concentration layer 10 may be formed not only in the active region 8 but also in the non-active region 9 as in the first modification example of the first preferred embodiment. Additionally, in the Schottky barrier diode 1P, the high concentration layer 10 may face the first guard region 31 through the low concentration layer 11 as in the second modification example of the first preferred embodiment.

Likewise, in the Schottky barrier diode 1Q of the third preferred embodiment, the high concentration layer 10 may be formed not only in the active region 8 but also in the non-active region 9, and the high concentration layer 10 may face the first guard region 31 through the low concentration layer 11.

Additionally, in the Schottky barrier diode 1Q of the third preferred embodiment, the impurity region 50 may be formed in a mesh shape so as to partition the high concentration layer 10 in a matrix manner in a plan view as in the first modification example of the second preferred embodiment. Additionally, in the Schottky barrier diode 1Q of the third preferred embodiment, the impurity region 50 may include a plurality of dotted impurity regions 54 disposed in a staggered manner in a plan view as in the second modification example of the second preferred embodiment.

In the Schottky barrier diodes 1, 1P, and 1Q of each of the preferred embodiments mentioned above, the semiconductor substrate 2 and the epitaxial layer 7 are each constituted of n type SiC, the high concentration layer 10 is an n type impurity region, and the high concentration layer 10 is a p type impurity region. However, unlike the preferred embodiments mentioned above, the semiconductor substrate 2 and the epitaxial layer 7 may be each constituted of p type SiC, the high concentration layer 10 may be a p type impurity region, and the impurity region 50 may be an n type impurity region.

Examples of features extracted from both the description and the drawings are hereinafter shown. [A1] to [A14] mentioned below provide a semiconductor device in which the barrier height has been reduced.

[A1] A semiconductor device including a semiconductor substrate having a principal surface, a semiconductor layer formed on the principal surface of the semiconductor substrate, the semiconductor layer including a first-conductivity-type low concentration layer in contact with the principal surface of the semiconductor substrate and a first-conductivity-type high concentration layer that is formed at a surface layer portion of a surface, which is on a side opposite to the principal surface, of the semiconductor layer and that has a higher impurity concentration than the low concentration layer, and a Schottky electrode that is formed on the surface of the semiconductor layer and that forms a Schottky junction portion between the high concentration layer and the Schottky electrode.

According to this configuration, the Schottky junction portion is formed between the high concentration layer whose impurity concentration is higher than the low concentration layer and the Schottky electrode in the semiconductor layer. Therefore, it is possible to make the barrier height smaller than the Schottky junction portion formed between the low concentration layer and the Schottky electrode.

[A2] The semiconductor device according to A1, wherein the impurity concentration of the low concentration layer is equal to or more than $1.0\times10^{12}$ cm$^{-3}$ and less than $1.0\times10^{17}$ $cm^{-3}$, and the impurity concentration of the high concentration layer is not less than $1.0\times10^{17}$ $cm^{-3}$ and not more than $1.0\times10^{20}$ $cm^{-3}$.

[A3] The semiconductor device according to A1 or A2, further including a second-conductivity-type annular guard region formed at the surface layer portion of the semiconductor layer, wherein the high concentration layer is formed in an active region surrounded by the guard region.

[A4] The semiconductor device according to A3, wherein a bottom portion of the high concentration layer is positioned closer to the surface of the semiconductor layer than to the bottom portion of the guard region.

[A5] The semiconductor device according to A3 or A4, wherein the high concentration layer is formed in a whole area of the active region.

[A6] The semiconductor device according to any one of A3 to A5, wherein the high concentration layer faces the guard region through the low concentration layer.

[A7] The semiconductor device according to any one of A3 to A6, wherein the high concentration layer is formed in a non-active region surrounding the active region, the non-active region being set at the surface of the semiconductor layer.

[A8] The semiconductor device according to any one of A1 to A7, further including a second-conductivity-type impurity region that is formed at the surface layer portion of the semiconductor layer so as to be in contact with the Schottky electrode and that forms a pn junction portion between the semiconductor layer and the second-conductivity-type impurity region.

[A9] The semiconductor device according to A8, further including a lattice defect region that is formed at the surface layer portion of the semiconductor layer so as to be in contact with the Schottky electrode and that has more lattice defects than the semiconductor layer, wherein the impurity region includes an inner impurity region disposed inside the lattice defect region so as to be in contact with the lattice defect region.

[A10] The semiconductor device according to A9, wherein resistance of the lattice defect region is higher than resistance of the semiconductor layer.

[A11] The semiconductor device according to A9 or A10, wherein a distance between the Schottky junction portion and the inner impurity region is larger than a thickness of the semiconductor layer.

[A12] The semiconductor device according to any one of A9 to A11, wherein the impurity region includes an outer impurity region disposed on a side opposite to the inner impurity region with the lattice defect region between the outer impurity region and the inner impurity region so as to be in contact with the lattice defect region.

[A13] The semiconductor device according to any one of A8 to A12, wherein the impurity region is formed in a mesh shape so as to partition the high concentration layer in a matrix manner in a plan view.

[A14] The semiconductor device according to any one of A8 to A13, wherein the impurity region includes a plurality of dotted impurity regions disposed in a staggered manner in a plan view.

Although the preferred embodiments of the present invention have been described in detail, these preferred embodiments are merely concrete examples used to clarify the technical contents of the present invention, and the present invention should not be understood by being limited to these concrete examples, and the scope of the present invention is limited solely by the appended claims.

This application corresponds to Japanese Patent Application No. 2020-160064 filed in the Japan Patent Office on Sep. 24, 2020, the entire disclosure of which is incorporated herein by reference.

REFERENCE SIGNS LIST

1: Schottky barrier diode
1P: Schottky barrier diode
1Q: Schottky barrier diode
2: semiconductor substrate
3: first principal surface
7: epitaxial layer
7_a_: surface
8: active region
9: non-active region
10: high concentration layer
11: low concentration layer
16: Schottky metal
30: guard region
30_a_: bottom portion
40: first impurity region
40_a_: bottom portion
46: unit impurity region
50: second impurity region
54: dotted impurity region
55: inner impurity region
56: outer impurity region
60: lattice defect region
L: distance
PJ: pn junction portion
SJ: Schottky junction portion
TE: thickness

The invention claimed is:

1. A semiconductor device comprising:

a semiconductor substrate having a principal surface;

a semiconductor layer formed on the principal surface of the semiconductor substrate, the semiconductor layer including a first-conductivity-type low concentration layer in contact with the principal surface of the semiconductor substrate and a first-conductivity-type high concentration layer that is formed at a surface layer portion of a surface, which is on a side opposite to the principal surface, of the semiconductor layer and that has a higher impurity concentration than the low concentration layer;

a Schottky electrode that is formed on a surface of the semiconductor layer and that forms a Schottky junction portion between the high concentration layer and the Schottky electrode; and a second-conductivity-type annular guard region formed at the surface layer portion of the semiconductor layer, wherein the high concentration layer is formed in an active region surrounded by the guard region such that the high concentration layer is in contact with the whole area of an inward end portion of the guard region in a plan view, and the high concentration layer is in contact with the low concentration layer.

2. The semiconductor device according to claim 1, wherein the impurity concentration of the low concentration layer is equal to or more than $1.0\times10^{12}$ $cm^{-3}$ and less than $1.0\times10^{17}$ $cm^{-3}$, and the impurity concentration of the high concentration layer is not less than $1.0\times10^{17}$ $cm^{-3}$ and not more than $1.0\times10^{20}$ $cm^{-3}$.

3. The semiconductor device according to claim 1, wherein a bottom portion of the high concentration layer is positioned closer to the surface of the semiconductor layer than to the bottom portion of the guard region.

4. The semiconductor device according to claim 1, wherein the high concentration layer is formed in a whole area of the active region.

5. The semiconductor device according to claim 1, wherein the high concentration layer faces the guard region through the low concentration layer.

6. The semiconductor device according to claim 1, wherein the high concentration layer is formed in a non-active region surrounding the active region, the non-active region being set at the surface of the semiconductor layer.

7. The semiconductor device according to claim 1, further comprising a second-conductivity-type impurity region that is formed at the surface layer portion of the semiconductor layer so as to be in contact with the Schottky electrode and that forms a pn junction portion between the semiconductor layer and the second-conductivity-type impurity region.

8. The semiconductor device according to claim 7, further comprising a lattice defect region that is formed at the surface layer portion of the semiconductor layer so as to be in contact with the Schottky electrode and that has more lattice defects than the semiconductor layer, wherein the impurity region includes an inner impurity region disposed inside the lattice defect region so as to be in contact with the lattice defect region.

9. The semiconductor device according to claim 8, wherein resistance of the lattice defect region is higher than resistance of the semiconductor layer.

10. The semiconductor device according to claim 8, wherein a distance between the Schottky junction portion and the inner impurity region is larger than a thickness of the semiconductor layer.

11. The semiconductor device according to claim 8, wherein the impurity region includes an outer impurity region disposed on a side opposite to the inner impurity region with the lattice defect region between the outer impurity region and the inner impurity region so as to be in contact with the lattice defect region.

12. The semiconductor device according to claim 7, wherein the impurity region is formed in a mesh shape so as to partition the high concentration layer in a matrix manner in a plan view.

13. The semiconductor device according to claim 7, wherein the impurity region includes a plurality of dotted impurity regions disposed in a staggered manner in a plan view.

14. The semiconductor device according to claim 8, wherein the impurity region includes a plurality of dotted impurity regions disposed in a staggered manner in a plan view.

15. The semiconductor device according to claim 9, wherein the impurity region includes a plurality of dotted impurity regions disposed in a staggered manner in a plan view.

16. The semiconductor device according to claim 10, wherein the impurity region includes a plurality of dotted impurity regions disposed in a staggered manner in a plan view.

17. The semiconductor device according to claim 11, wherein the impurity region includes a plurality of dotted impurity regions disposed in a staggered manner in a plan view.

18. The semiconductor device according to claim 12, wherein the impurity region includes a plurality of dotted impurity regions disposed in a staggered manner in a plan view.

19. The semiconductor device according to claim 13, wherein the impurity region includes a plurality of dotted impurity regions disposed in a staggered manner in a plan view.

* * * * *